United States Patent
Sakaguchi

(10) Patent No.: US 10,206,283 B1
(45) Date of Patent: Feb. 12, 2019

(54) ELECTRONIC DEVICE

(71) Applicant: SHINKO ELECTRIC INDUSTRIES CO., LTD., Nagano-shi, Nagano (JP)

(72) Inventor: Hideaki Sakaguchi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 16/127,823

(22) Filed: Sep. 11, 2018

(30) Foreign Application Priority Data

Sep. 15, 2017 (JP) .................. 2017-177737

(51) Int. Cl.
*H05K 1/14* (2006.01)
*H05K 1/11* (2006.01)
*H01L 23/498* (2006.01)

(52) U.S. Cl.
CPC ............ *H05K 1/117* (2013.01); *H05K 1/144* (2013.01); *H01L 23/49838* (2013.01)

(58) Field of Classification Search
CPC .................. H05K 1/117; H05K 1/144; H05K 2201/10386; H05K 3/368
See application file for complete search history.

(56) References Cited

U.S. PATENT DOCUMENTS

| | | | | |
|---|---|---|---|---|
| 4,555,151 A | * | 11/1985 | Neese | H01R 12/52 439/82 |
| 5,910,885 A | * | 6/1999 | Gulachenski | H01L 25/105 257/E25.023 |
| 6,700,196 B1 | * | 3/2004 | Kautz | H01L 22/22 257/703 |
| 2002/0044433 A1 | * | 4/2002 | Inoue | H05K 1/029 361/784 |
| 2003/0119340 A1 | * | 6/2003 | Fukumoto | H01R 13/04 439/65 |
| 2005/0189566 A1 | * | 9/2005 | Matsumoto | H02M 3/33538 257/200 |
| 2009/0009979 A1 | * | 1/2009 | Mori | B23K 1/0016 361/784 |
| 2009/0215287 A1 | * | 8/2009 | Mori | H05K 1/144 439/74 |

FOREIGN PATENT DOCUMENTS

JP 2007-026964 2/2007

* cited by examiner

*Primary Examiner* — Steven T Sawyer
(74) *Attorney, Agent, or Firm* — Rankin, Hill & Clark LLP

(57) ABSTRACT

An electronic device includes a first wiring substrate having a first main surface, first conductive contacts, each of which is provided upright on the first main surface, has a U-shape opening toward a side of the first wiring substrate, and comprises a first contact part extending toward the side of the first wiring substrate, a second wiring substrate having a second main surface, second conductive contacts, each of which is provided upright on the second main surface, has a U-shape opening toward a side of the second wiring substrate, and comprises a second contact part extending toward the side of the second wiring substrate and being in contact with the first contact part, and, third conductive contacts, each of which has a U-shape opening toward the conductive contacts and is configured to sandwich the first and second contact parts and to fix the first and second wiring substrates.

8 Claims, 28 Drawing Sheets

ELECTRONIC DEVICE

CROSS-REFERENCE TO RELATED APPLICATION

The present application claims priority from Japanese Patent Application No. 2017-177737 filed on Sep. 15, 2017, the entire content of which is incorporated herein by reference.

BACKGROUND

Technical Field

The present disclosure relates to an electronic device.

Related Art

There are various types of electronic devices in which a plurality of wiring substrates is combined. Among them, an electronic device referred to as a POP (Package On Package) is configured by stacking vertically a plurality of substrates, so that it is possible to reduce a planar size, as compared to a configuration where the respective substrates are provided in a horizontal direction.

In the POP, solder balls are provided between the upper and lower wiring substrates and the solder balls are then reflowed, so that the respective wiring substrates are electrically and mechanically connected.

However, when the reflow is performed in this way, electronic components such as a CPU (Central Processing Unit), a memory and the like mounted on each wiring substrate are reflowed multiple times and are thus thermally damaged, so that reliability of the electronic components may be lowered.

Patent Document 1: JP-A-2007-26964

SUMMARY

Exemplary embodiments of the present invention provide an electronic device in which upper and lower wiring substrates can be connected to each other without using solder.

An electronic device according to an exemplary embodiment, comprises:

a first wiring substrate having a first main surface;

a plurality of first conductive contacts, each of which is provided upright on a peripheral edge part of the first main surface, has a U-shape opening toward a side of the first wiring substrate, and comprises a first contact part extending toward the side of the first wiring substrate, a second wiring substrate having a second main surface facing the first main surface;

a plurality of second conductive contacts, each of which is provided upright on a peripheral edge part of the second main surface, has a U-shape opening toward a side of the second wiring substrate, and comprises a second contact part extending toward the side of the second wiring substrate and being in contact with the first contact part, and;

a plurality of third conductive contacts, each of which has a U-shape opening toward each of the first conductive contact and the second conductive contact and is configured to sandwich the first contact part and the second contact part from a side of each of the first wiring substrate and the second wiring substrate and to fix the first wiring substrate and the second wiring substrate; and a plurality of electronic components mounted on each of the first wiring substrate and the second wiring substrate.

According to the exemplary embodiment, since the third conductive contacts are mounted to the first conductive contacts and the second conductive contacts, the first wiring substrate and the second wiring substrate are fixed by the first to third conductive contacts. Thereby, since it is not necessary to connect the first wiring substrate and the second wiring substrate each other by solder, it is possible to prevent a situation where reliability of the electronic components is lowered due to heat when reflowing the solder.

Also, the first to third conductive contacts are respectively formed to have a U-shape, so that the conductive contacts have elasticity and it is possible to disperse a pressure, which is to be applied when stacking the first wiring substrate and the second wiring substrate, with the first to third conductive contacts. Thereby, when manufacturing the electronic device, it is possible to prevent the first wiring substrate and the second wiring substrate from being damaged.

DETAILED DESCRIPTION

Before describing exemplary embodiments, the matters that have been examined by the inventor are described.

Figure 1A:
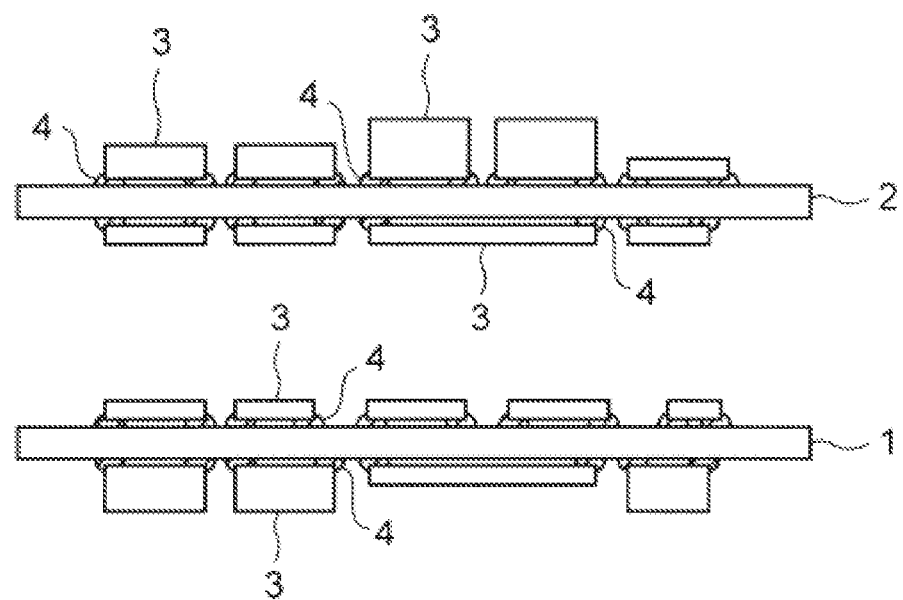
FIGS. 1A and 1B are sectional views depicting a state where an electronic device used for examination is being manufactured.
Figure 1B:
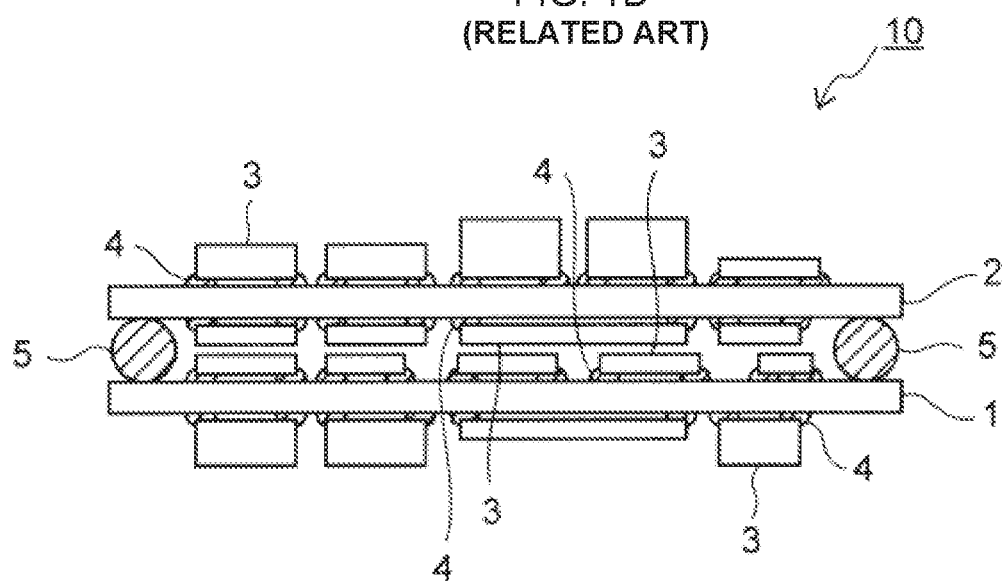

FIGS. 1A and 1B are sectional views depicting a state where an electronic device used for the examination is being manufactured.

In this example, a POP is manufactured as an electronic device, as follows.

First, as shown in FIG. 1A, a first wiring substrate 1 and a second wiring substrate 2 are prepared and are made to face each other.

Both surfaces of each of the wiring substrates 1, 2 are mounted thereon with various devices such as a CPU, a memory and the like, as electronic components 3. The electronic components 3 are fixed in advance to each of the wiring substrates 1, 2 by reflowing solders 4 before performing this process.

Then, as shown in FIG. 1B, solder balls 5 are arranged between the wiring substrates 1, 2. In this state, the solder balls 5 are reflowed and melted, so that the wiring substrates 1, 2 are electrically and mechanically connected by the solder balls 5.

By the above processes, a basic structure of an electronic device 10 relating to this example is completed.

According to the electronic device 10, since the plurality of wiring substrates 1, 2 is vertically stacked, it is possible to reduce a planar size, as compared to a configuration where the respective wiring substrates 1, 2 are provided in a horizontal direction, and to implement high functions by the various electronic components 3.

However, according to the above method, it is necessary to reflow the solder balls 5 in the process of FIG. 1B, so that the reliability of the electronic components 3 may be lowered due to heat upon the reflow.

The lowering in the reliability becomes more conspicuous as the number of reflow times increases. Therefore, a manufacturer of the electronic components 3 sets an upper limit for the number of reflow times, and suggests that the number of reflow times should be equal to or smaller than the upper limit so as to guarantee the reliability of the electronic components 3, in some cases. The upper limit of the number of reflow times is two times in many cases, although it is different depending on types of the electronic components 3.

In the above example, the solders 4 are reflowed on each surface of the first wiring substrate 1 and the electronic components 3 are thus mounted on the first wiring substrate 1. Therefore, there are the electronic components 3, which have been already reflowed two times before reflowing the solder balls 5, on the first wiring substrate 1. The electronic components 3 on the second wiring substrate 2 are also the same.

For this reason, as described above, when the solder balls 5 are reflowed, there are the electronic components 3 having been reflowed three times, so that the number of reflow times may exceed the upper limit.

In the meantime, in order to secure an interval between the first wiring substrate 1 and the second wiring substrate 2, in which the electronic components 3 can be accommodated, resin core balls or copper core balls having surfaces on which solders are plated may be used instead of the solder balls 5. Also in this case, since the reflow for melting the solders on the surfaces of the core balls is required, the reliability of the electronic components 3 is lowered due to the reflow, as described above.

Furthermore, when the solder balls 5 are reflowed so as to separate the respective wiring substrates 1, 2, the reliability of the electronic components 3 is further lowered due to the heat of the reflow, so that it is difficult to separate the respective wiring substrates 1, 2 after completing the electronic device 10. As a result, it is difficult to replace the wiring substrates 1, 2 after completing the electronic device 10. Also, it is difficult to examine external appearances of the electronic components 3 mounted on the facing surfaces of the respective wiring substrates 1, 2 after the completion.

Figure 2:
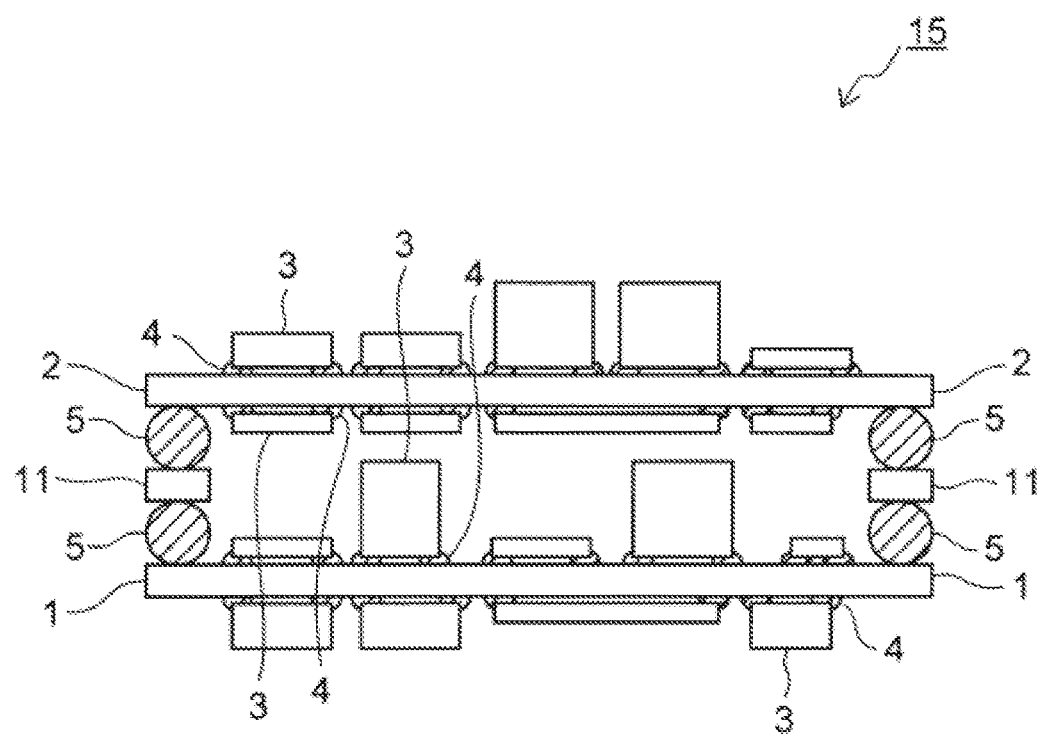
FIG. 2 is a sectional view of another electronic device used for examination.

FIG. 2 is a sectional view of another electronic device used for examination.

In FIG. 2, the same elements as those in FIGS. 1A and 1B are denoted with the same reference numerals, and the descriptions thereof are omitted.

In an electronic device 15, an intermediate substrate 11 is provided between the first wiring substrate 1 and the second wiring substrate 2.

The intermediate substrate 11 and the first wiring substrate 1 are connected by the solder balls 5, and the intermediate substrate 11 and the second wiring substrate 2 are then connected by the solder balls 5.

A substrate having a hollow central part is used as the intermediate substrate 11, so that it is possible to accommodate the thick electronic components 3 between the wiring substrates 1, 2 and to relax a thickness limit of the electronic component 3 that can be mounted on the electronic device 15.

However, in the electronic device 15, since the solder balls 5 on both surfaces of the intermediate substrate 11 are separately reflowed, the number of reflow times to be performed for the electronic components 3 further increases than the example of FIGS. 1A and 1B, so that the reliability of the electronic components 3 is further lowered.

In the below, each exemplary embodiment by which it is possible to manufacture an electronic device without reflowing the solder balls is described.

First Exemplary Embodiment

An electronic device of a first exemplary embodiment is described with reference to manufacturing processes thereof.

FIGS. 3A to 6 are sectional views depicting states where the electronic device of the first exemplary embodiment is being manufactured.

In the first exemplary embodiment, a POP is manufactured as an electronic device, as follows.

Figure 3A:
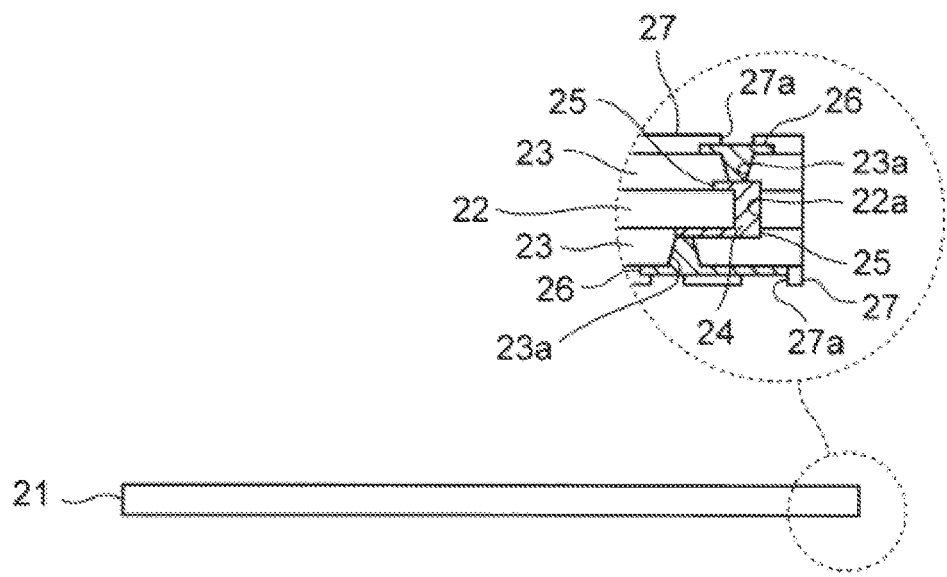
FIGS. 3A and 3B are sectional views depicting a state where an electronic device in accordance with a first exemplary embodiment is being manufactured (1 thereof).

First, as shown in FIG. 3A, a first wiring substrate 21 having a plurality of insulation layers 23 and wiring layers 25, 26 provided on both surfaces of a core base material 22 is prepared.

The core base material 22 is a glass epoxy substrate in which epoxy resin is impregnated in glass cloth, and has a plurality of through-holes 22a. The through-hole 22a and opening ends thereof are formed with copper plated films, so that a through-electrode 24 is provided in the through-hole 22a and the wiring layer 25 is provided on the core base material 22 around the through-electrode 24.

Also, the insulation layer 23 is a resin layer such as a phenol resin, a polyimide resin and the like. The insulation layer 23 is formed with a via 23a reaching the wiring layer 25 by laser processing or the like, and the wiring layer 26 is formed in the via 23a and on the insulation layer 23 around the via by copper plating.

On the uppermost insulation layer 23, a solder resist layer 27 having an opening 27a, through which the wiring layer 26 is exposed, is formed.

Figure 3B:
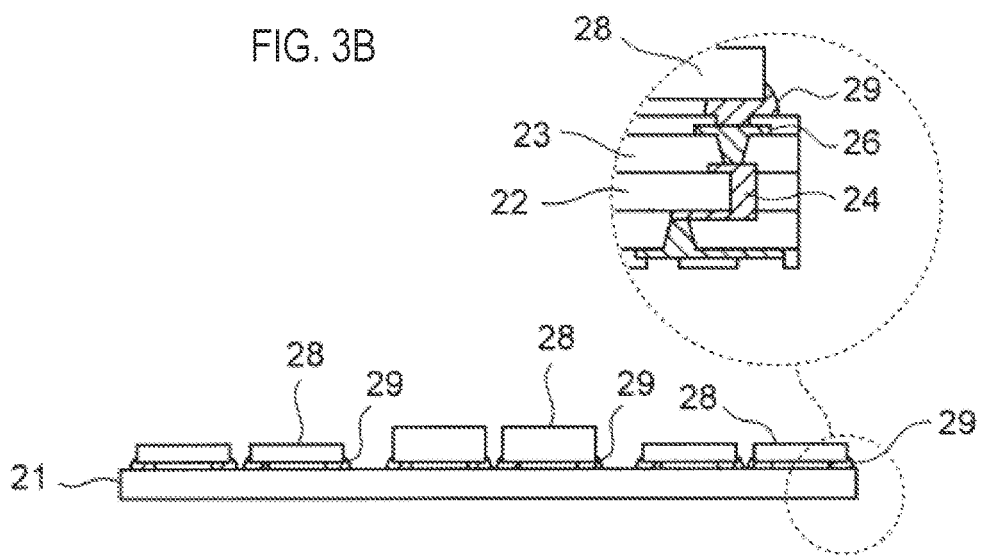

Subsequently, as shown in FIG. 3B, a plurality of electronic components 28 is placed on one of both main surfaces of the first wiring substrate 21 via solders 29. Then, the solders 29 are reflowed, so that the respective electronic components 28 are connected to the wiring layer 26 via the solders 29.

As the electronic components 28 used in this process, for example, a processor such as a CPU, a memory, a coil, a resistance element, a capacitor, a crystal oscillator, a battery and the like may be exemplified.

Figure 4A:
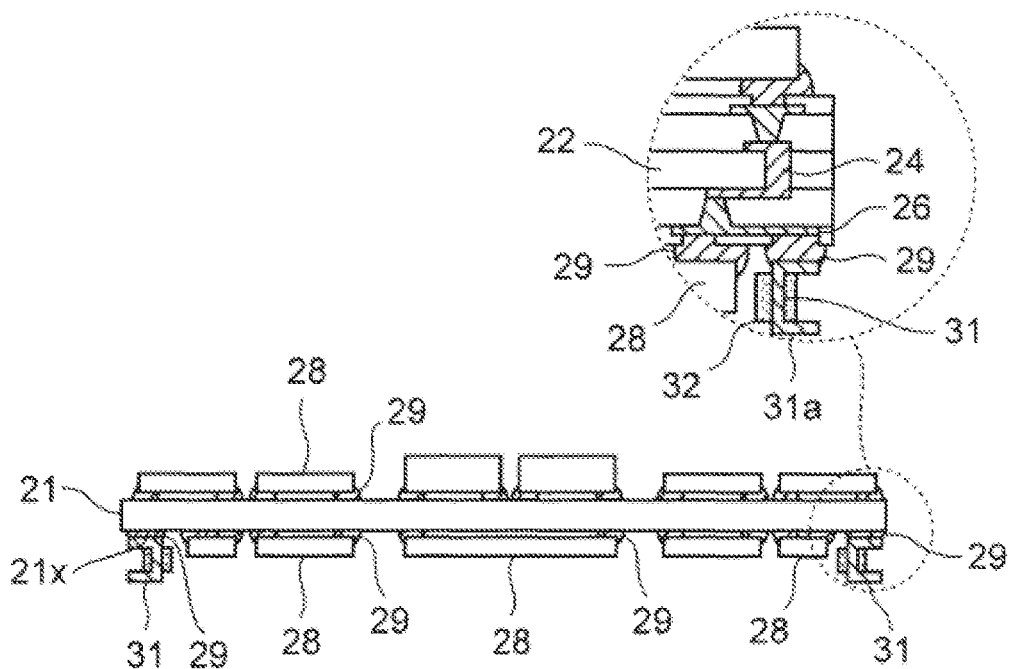
FIGS. 4A and 4B are sectional views depicting a state where the electronic device in accordance with the first exemplary embodiment is being manufactured (2 thereof).

Subsequently, a process shown in FIG. 4A is described.

First, a plurality of electronic components 28 and first conductive contacts 31 are placed on the other main surface of the first wiring substrate 21 via solders 29.

The first conductive contact 31 has a U-shaped section opening toward a side of the first wiring substrate 21, and is manufactured by pressing a metal plate such as pure copper, brass, phosphor bronze or the like.

Also, a leading end of the first conductive contact 31 is provided with a first contact part 31a extending toward a side of the first wiring substrate 21.

The solders 29 are reflowed, so that the electronic components 28 and the first conductive contacts 31 are respectively connected to the wiring layer 26 via the solders 29 at the same time.

Figure 7:
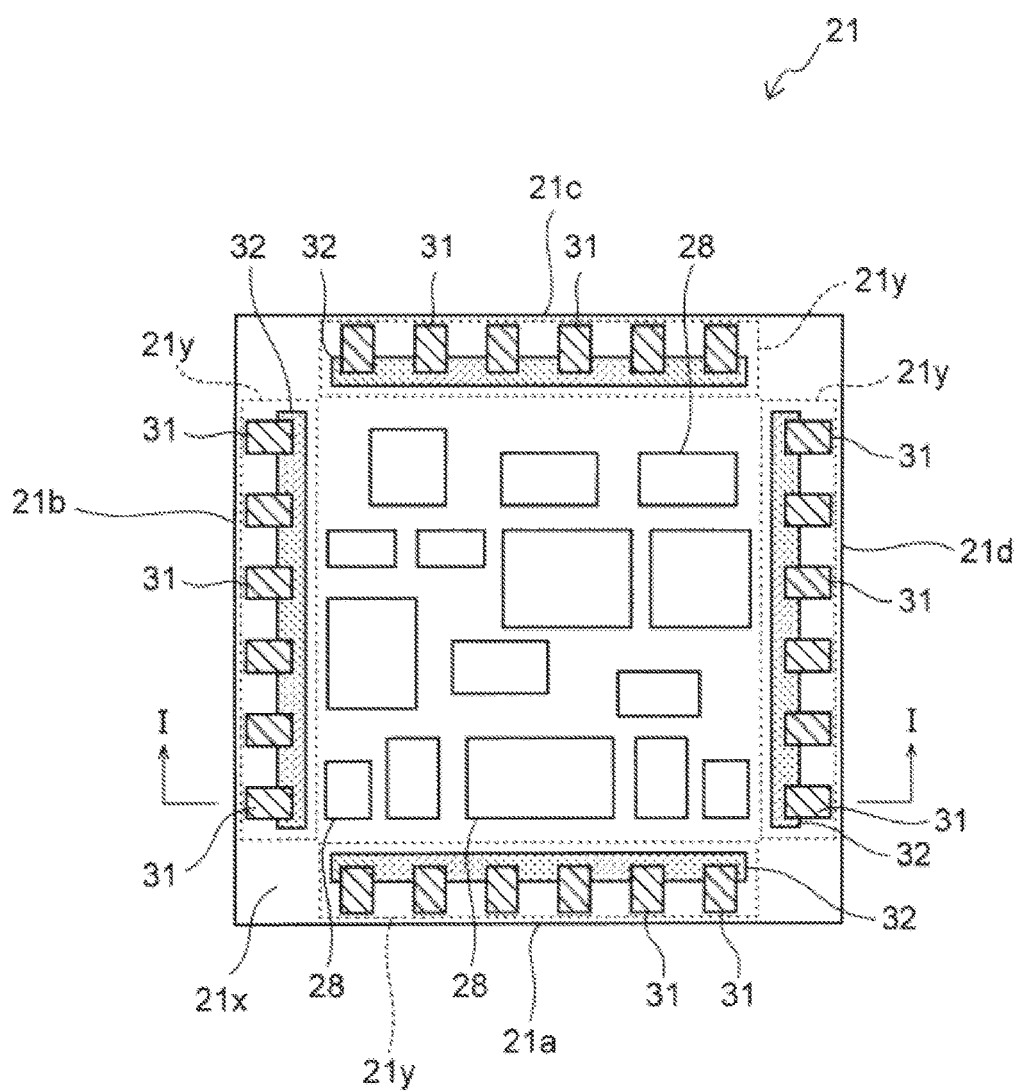
FIG. 7 is a plan view of a first wiring substrate in accordance with the first exemplary embodiment.

FIG. 7 is a plan view of the first wiring substrate 21 upon completion of this process, and FIG. 4A corresponds to a sectional view taken along a line I-I of FIG. 7.

As shown in FIG. 7, the first wiring substrate 21 has a rectangular shape having four sides 21a to 21d, as seen from above, and has a first main surface 21x defined by the respective sides 21a to 21d.

In this example, the first conductive contacts 31 are fixed to peripheral edge parts 21y of the first main surface 21x, and the first conductive contacts 31 are provided with intervals along each of the sides 21a to 21d.

Also, the plurality of first conductive contacts 31 is respectively coupled in advance by a first resin part 32 before this process. Thereby, it is possible to collectively mount the plurality of first conductive contacts 31 on the first wiring substrate 21, and to simplify the process, as compared to a configuration where the plurality of first conductive contacts 31 is individually mounted on the first wiring substrate 21.

Although a shape of the first resin part 32 is not particularly limited, the first resin parts 32 are respectively formed to extend along each of the sides 21a to 21d, for example. Thereby, the first resin part 32 and each of the sides 21a to 21d are made to be parallel with each other, so that it is possible to positionally align the first resin part 32 and the first wiring substrate 21 and to reduce a labor necessary for the position alignment.

In the meantime, as a material of the first resin part 32, PBT (polybutylene terephthalate), epoxy resin, LCP (Liquid Crystal Polymer) and the like may be used, for example.

Figure 8:
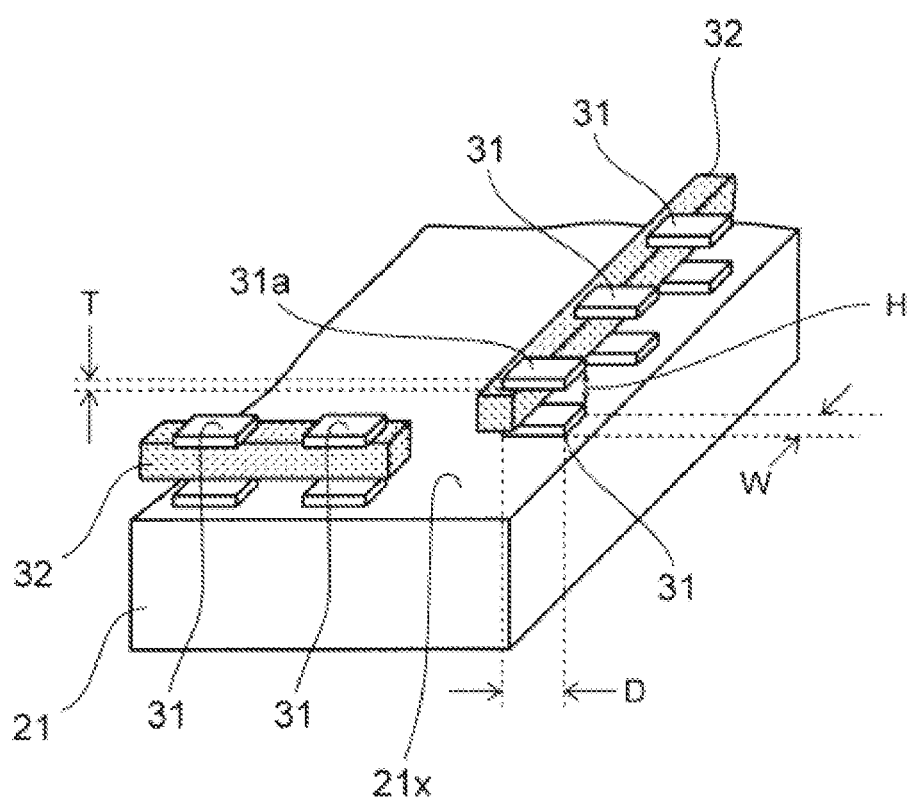
FIG. 8 is an enlarged perspective view of a corner part of the first wiring substrate in accordance with the first exemplary embodiment.

FIG. 8 is an enlarged perspective view of a corner part of the first wiring substrate 21.

As shown in FIG. 8, the first conductive contacts 31 are respectively provided upright with being embedded in the first resin part 32 on the first main surface 21x. This structure is obtained by manufacturing the first conductive contacts 31 having a U-shape through press working or the like and then embedding the first conductive contact 31s in the first resin part 32 through injection molding, for example.

Also, a size of each of the first conductive contacts 31 is not particularly limited. For example, a width is W about 0.3 mm to 1 mm, and a height H is about 0.8 mm to 4 mm. Also, a depth D is about 0.4 mm to 2 mm, and a thickness of the first contact part 31a is about 0.2 mm to 1 mm.

By the above processes, the processing for the first wiring substrate 21 is completed.

Figure 4B:
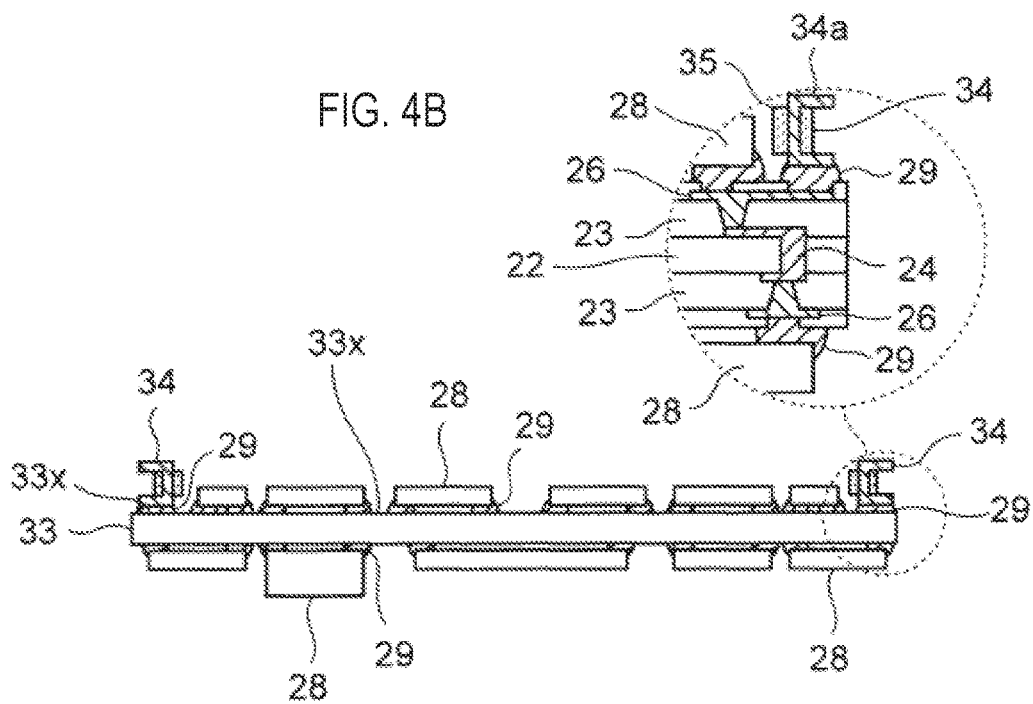

Subsequently, as shown in FIG. 4B, a second wiring substrate 33 is prepared separately from the first wiring substrate 21.

In the meantime, since a sectional structure of the second wiring substrate 33 is similar to that of the first wiring substrate 21, the description thereof is omitted.

Then, the same processes as FIGS. 3B to 4A are performed for the second wiring substrate 33, so that a plurality of second conductive contacts 34 is provided upright on a second main surface 33x of the second wiring substrate 33.

A shape and a material of the second conductive contact 34 are not also particularly limited. In this example, the first conductive contact 31 is applied to the second conductive contact 34 (i.e., the materials and shapes of the first and second conductive contacts 31, 34 are the same), so that the manufacturing cost of the second conductive contact 34 is saved.

The second conductive contact 34 has a U-shaped section opening toward a side of the second wiring substrate 32, and a leading end thereof is provided with a second contact part 34a extending toward a side of the second wiring substrate 32.

Figure 9A:
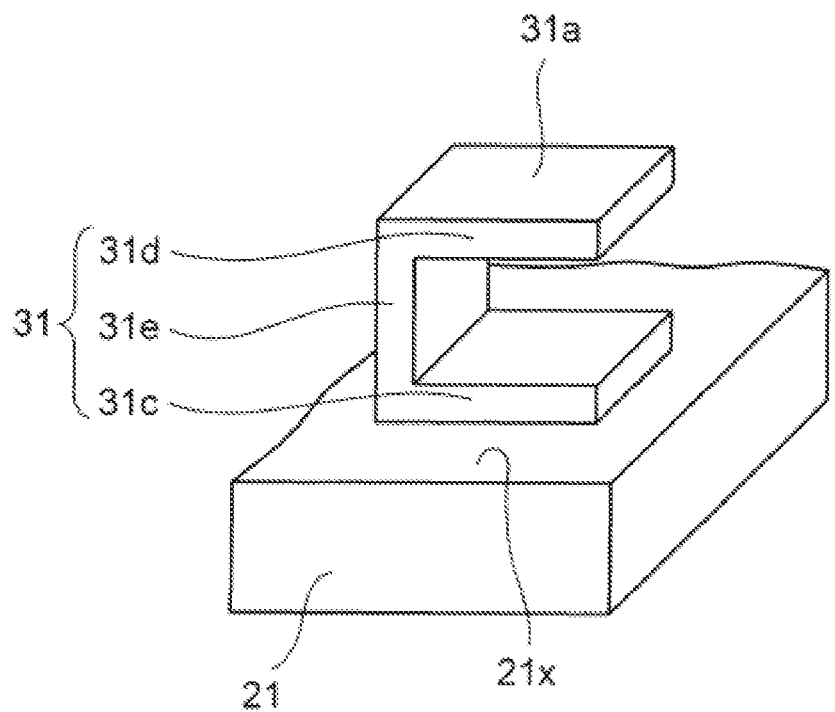
FIG. 9A is a perspective view of one first wiring substrate in accordance with the first exemplary embodiment.
Figure 9B:
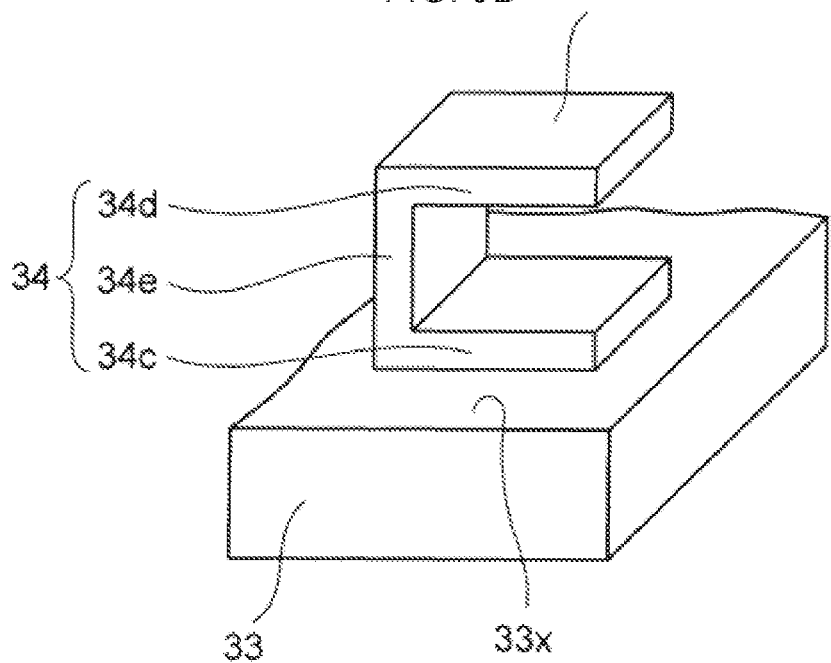
FIG. 9B is a perspective view of one second wiring substrate in accordance with the first exemplary embodiment.

FIG. 9A is a perspective view of one first conductive contact 31, and FIG. 9B is a perspective view of one second conductive contact 34.

As shown in FIG. 9A, the first conductive contact 31 has three flat plate parts, i.e., first and second horizontal parts 31c, 31d extending toward a side of the first wiring substrate 21 and an upright part 31e provided upright so as to be perpendicular to the first main surface 21x.

The first horizontal part 31c is connected to the first wiring substrate 21, and the second horizontal part 31d is the first contact part 31a.

Likewise, as shown in FIG. 9B, the second conductive contact 34 has also three flat plate parts, i.e., first and second horizontal parts 34c, 34d extending toward a side of the second wiring substrate 33 and an upright part 34e provided upright so as to be perpendicular to the second main surface 33x.

The first horizontal part 34c is connected to the second wiring substrate 33, and the second horizontal part 34d is the second contact part 34a.

Figure 10:
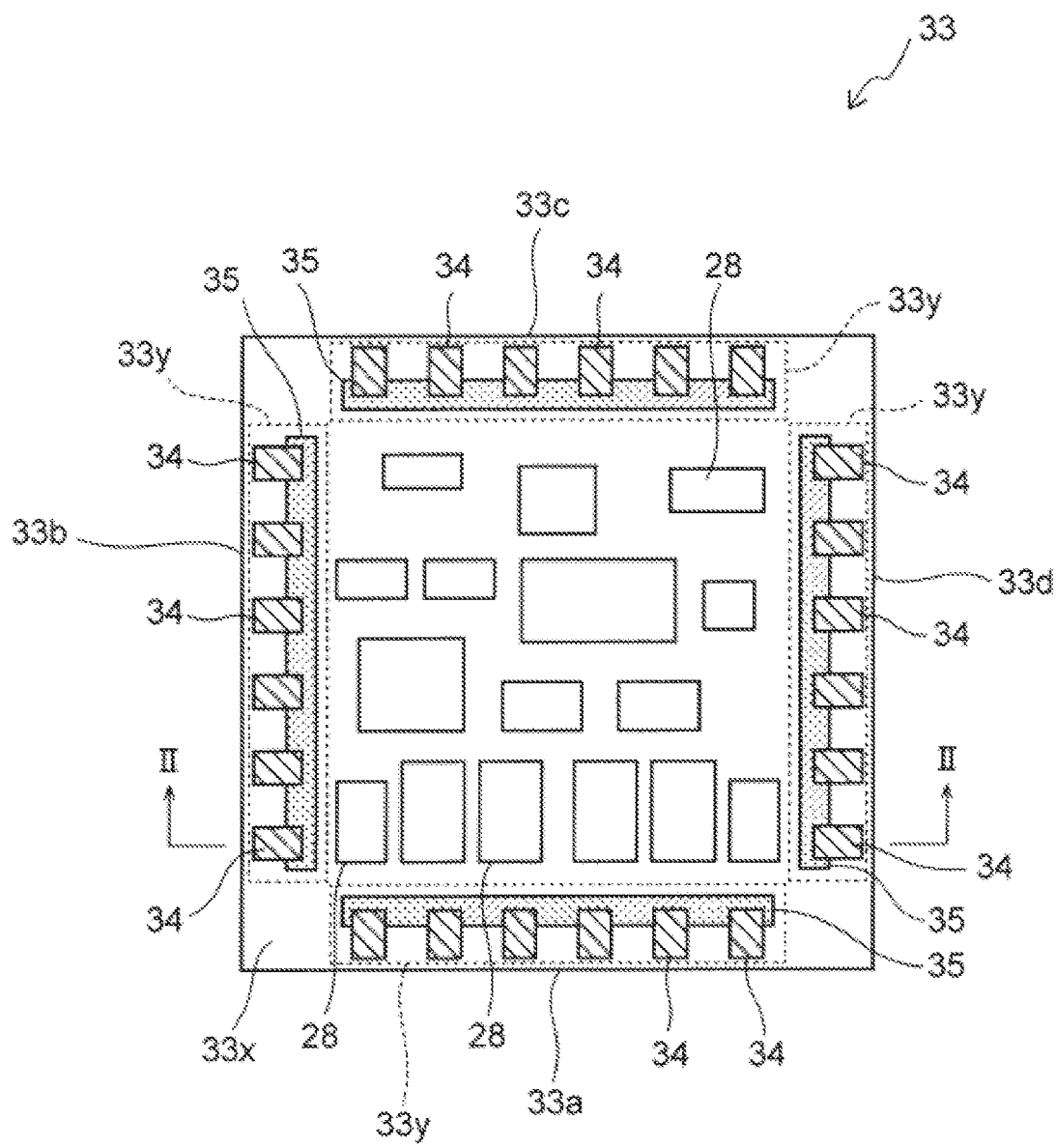
FIG. 10 is a plan view of the second wiring substrate in accordance with the first exemplary embodiment.

FIG. 10 is a plan view of the second wiring substrate 33, and FIG. 4B corresponds to a sectional view taken along a line II-II of FIG. 10.

As shown in FIG. 10, like the first wiring substrate 21, the second wiring substrate 33 has also a rectangular shape having four sides 33a to 33d, as seen from above.

The second conductive contacts 34 are provided with intervals along each of the sides 33a to 33d at peripheral edge parts 33y of the second main surface 33x.

The second conductive contacts 34 are respectively coupled in advance by a second resin part 35. Thereby, it is possible to collectively mount the plurality of second conductive contacts 34 on the second wiring substrate 33.

A shape and a material of the second resin part 35 are the same as those of the first resin part 32 (refer to FIG. 7), and the second resin part 35 is formed to extend each of the sides 33a to 33d.

Figure 5A:
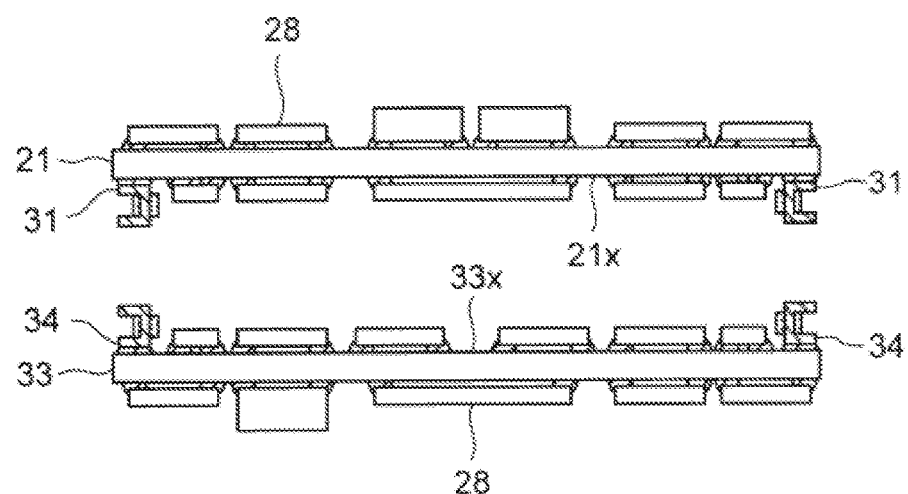
FIGS. 5A and 5B are sectional views depicting a state where the electronic device in accordance with the first exemplary embodiment is being manufactured (3 thereof).

Subsequently, as shown in FIG. 5A, the first wiring substrate 21 and the second wiring substrate 33 are positionally aligned and the main surfaces 21x, 33x thereof are made to face each other.

Figure 5B:
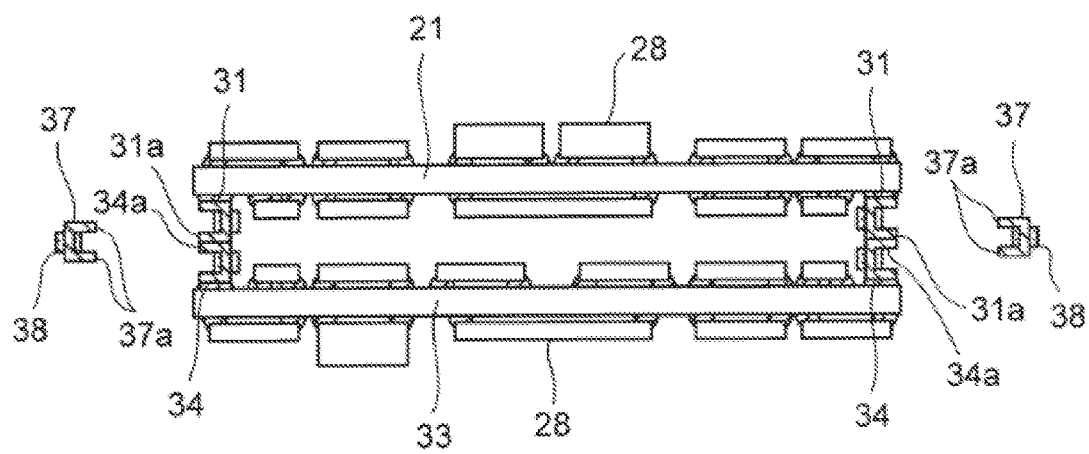

Then, as shown in FIG. 5B, the contact parts 31a, 34a of the first conductive contacts 31 and the second conductive contacts 34 are contacted each other, and third conductive contacts 37 are arranged at sides of the contact parts 31a, 34a.

The third conductive contact 37 has a U-shaped section opening toward each of the conductive contacts 31, 34, and has a pair of third contact parts 37a facing each other.

In the first exemplary embodiment, in order to save the manufacturing cost of the third conductive contact 37, the first conductive contact 31 is applied to the third conductive contact 37.

Figure 11:
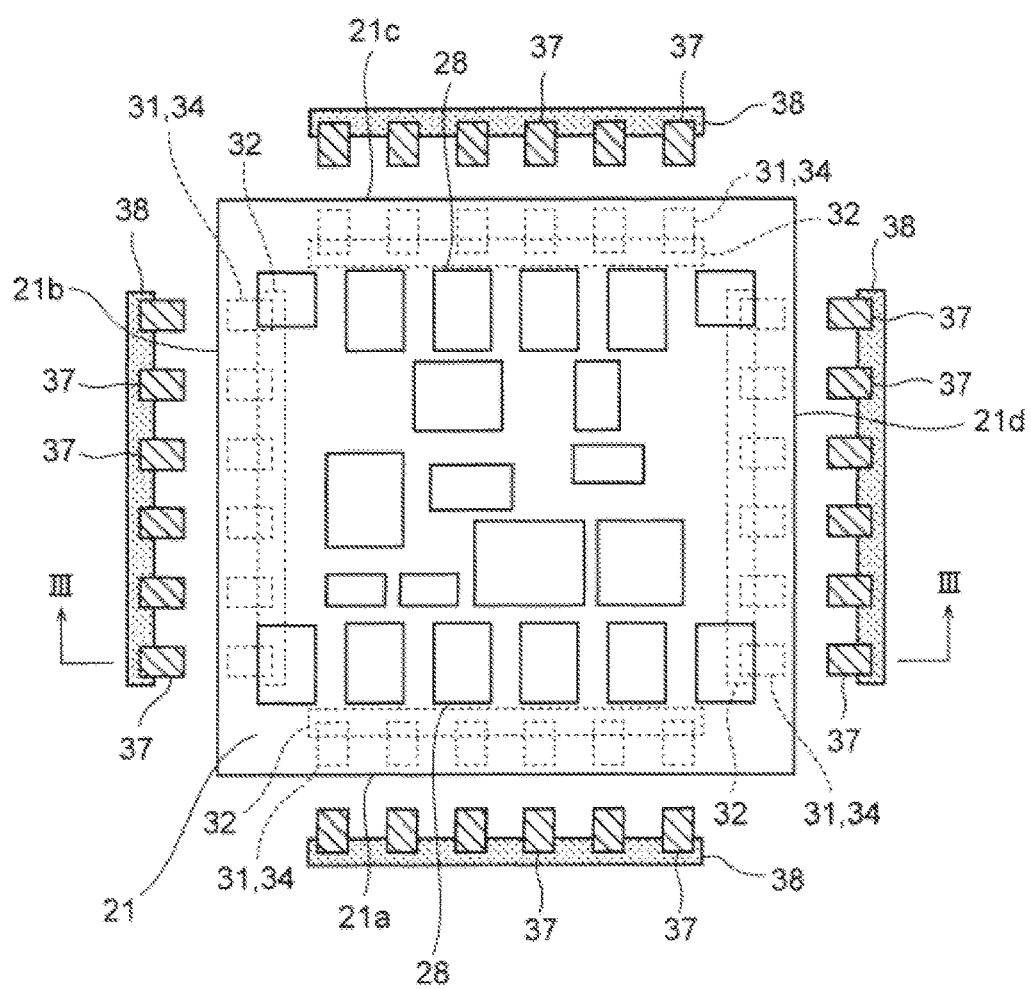
FIG. 11 is a plan view depicting a state where the electronic device in accordance with the first exemplary embodiment is being manufactured.

FIG. 11 is a plan view depicting this process, and FIG. 5B corresponds to a sectional view taken along a line III-III of FIG. 11.

As shown in FIG. 11, the plurality of third conductive contacts 37 is provided in correspondence to each of the first conductive contacts 31 and the second conductive contacts 34.

The third conductive contacts 37 are respectively coupled by the third resin part 38 at each of the sides 21a to 21d, so that it is possible to easily handle the plurality of third conductive contacts 37.

Figure 12:
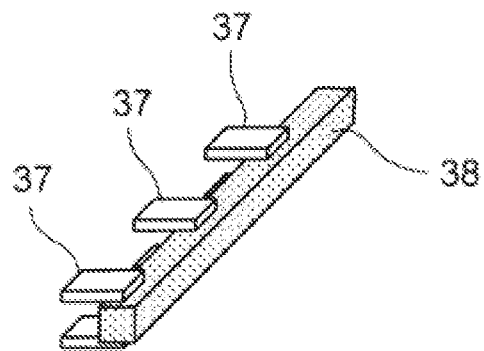
FIG. 12 is a perspective view of a third conductive contact and a third resin part in accordance with the first exemplary embodiment.

FIG. 12 is a perspective view of the third conductive contacts 37 and the third resin part 38.

Although a shape and a material of the third resin part 38 are not particularly limited, the first resin part 32 or the second resin part 35 is preferably applied to the third resin part 38 so as to save the manufacturing cost of the third resin part 38.

Figure 13:
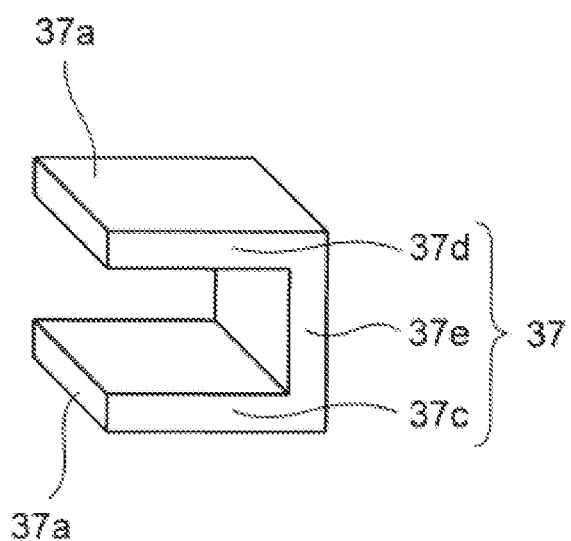
FIG. 13 is a perspective view of one third conductive contact in accordance with the first exemplary embodiment.

FIG. 13 is a perspective view of one third conductive contact 37.

Like the first conductive contact 31 and the second conductive contact 34, the third conductive contact 37 has also three flat plate parts, i.e., first and second horizontal parts 37c, 37d and an upright part 37e provided to be perpendicular to the parts.

The first and second horizontal parts 37c, 37d are the third contact parts 37a.

Figure 6:
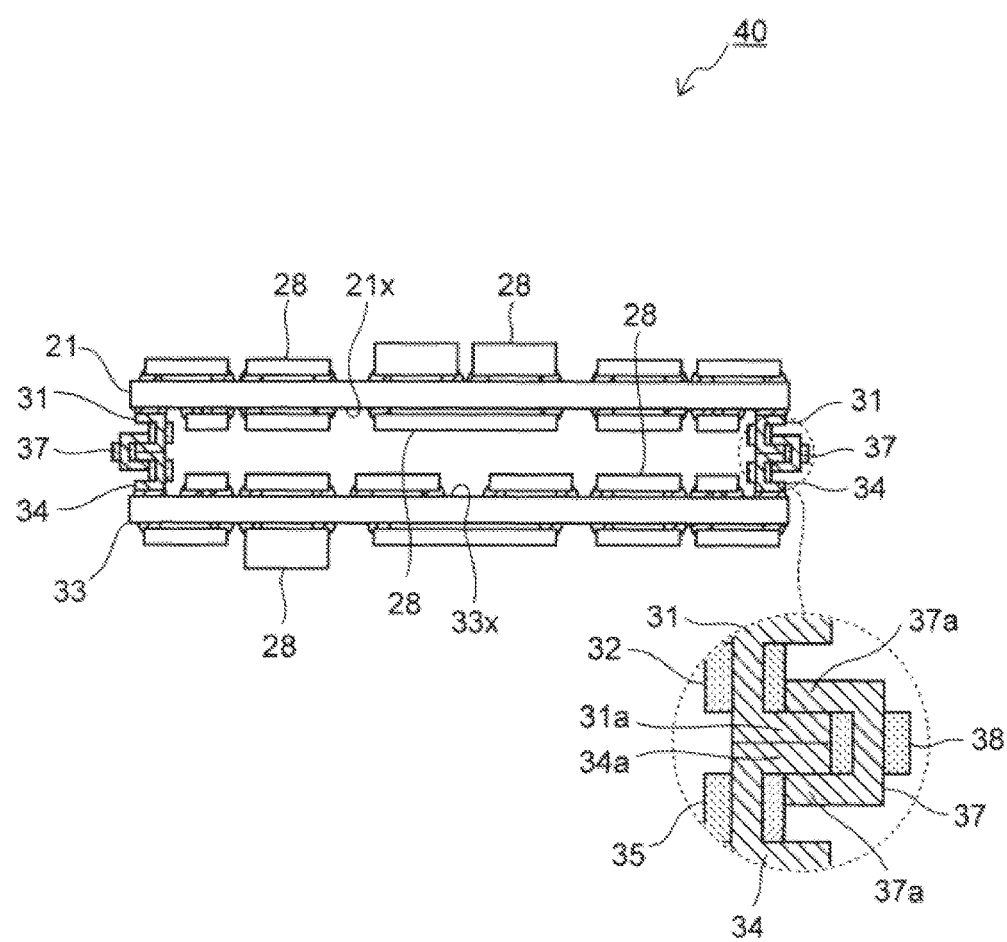
FIG. 6 is a sectional view depicting a state where the electronic device in accordance with the first exemplary embodiment is being manufactured (4 thereof).

Subsequently, as shown in FIG. 6, the third conductive contacts 37 are respectively mounted to each of the conductive contacts 31, 34 from sides of the respective wiring substrates 21, 33. Thereby, the first contact parts 31a and the second contact parts 34a are sandwiched by the third contact parts 37a of the third conductive contacts 37, so that the wiring substrates 21, 33 are electrically and mechanically connected.

In this example, the third conductive contacts 37 are not fixed to each of the wiring substrates 21, 33 by solders or the like, and the third conductive contacts 37 are instead detachably mounted to the respective conductive contacts 31, 34, respectively.

Meanwhile, in order to prevent the third conductive contact 37 from being detached from each of the conductive contacts 31, 34, surfaces of the conductive contacts 31, 34, 37 may be roughened to provide concavity and convexity. As the roughening processing, wet etching may be exemplified. Also, a mold for forming each of the conductive contacts 31, 34, 37 may be formed with concavity and convexity, and the concavity and convexity may be transferred to the surfaces of the conductive contacts 31, 34, 37 upon the formation.

Also, as a material of each of the conductive contacts 31, 34, 37, brass or phosphor bronze having an excellent spring property may be adopted to firmly fit the conductive contacts 31, 34, 37 together by the spring property.

On the other hand, instead of using the spring property of the material, a tin film having excellent ductility may be formed on the surfaces of the respective conductive contacts 31, 34, 37 by a plating method. Thereby, the respective conductive contacts 31, 34, 37 are favorably closely contacted each other via the tin films, so that it is possible to securely fit the conductive contacts 31, 34, 37 together. In this case, a copper film, a nickel film or the like may be formed on a lower layer of the tin film by the plating method.

Also, in order to prevent oxidation of the surfaces of the respective conductive contacts 31, 34, 37, a nickel film and a gold film may be formed in corresponding order on the surfaces thereof by the plating method.

By the above processes, a basic structure of an electronic device 40 in accordance with the first exemplary embodiment is completed.

As described above, the electronic device 40 is a POP, and a high functionality thereof is implemented by the plurality of electronic components 28.

Meanwhile, in this example, the electronic components 28 are mounted on both the main surfaces of the first wiring substrate 21. However, the electronic components 28 may be mounted on only one main surface. This also applies to the second wiring substrate 33.

Also, the number of the wiring substrates to be stacked is not particularly limited, and three or more wiring substrates may be stacked.

Figure 14:
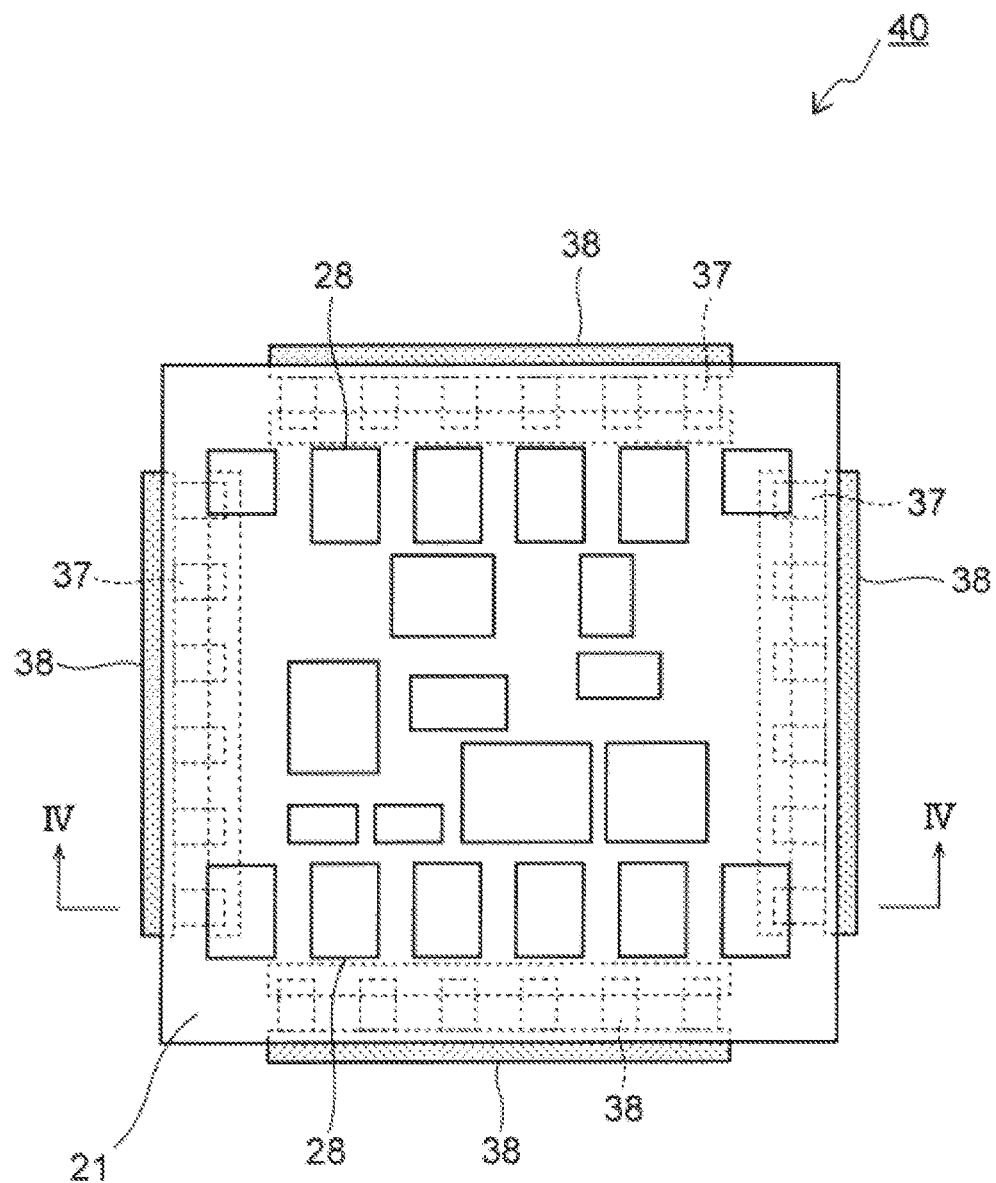
FIG. 14 is a plan view of an electronic device in accordance with the first exemplary embodiment.

FIG. 14 is a plan view of the electronic device 40, and FIG. 6 corresponds to a sectional view taken along a line IV-IV of FIG. 14.

As shown in FIG. 14, in the electronic device 40, the third conductive contacts 37 are inserted from the four sides of the first wiring substrate 21.

According to the first exemplary embodiment, as shown in FIG. 6, since the respective wiring substrates 21, 33 are connected by the first to third conductive contacts 31, 34, 37, it is not necessary to provide solders for connecting the wiring substrates 21, 33. As a result, it is not necessary to reflow the solders and there is no concern that reliability of each electronic component 28 will be lowered due to heat upon the reflow.

Furthermore, the third conductive contact 37 is detachably mounted to each of the conductive contacts 31, 34. Therefore, even after the completion of the electronic device 40, it is possible to simply separate the respective wiring substrates 21, 33 by detaching the third conductive contacts 37 from each of the conductive contacts 31, 34.

Therefore, when a defect is found in any one of the wiring substrates 21, 33, it is possible to replace the defective wiring substrate with a non-defective wiring substrate by separating the respective wiring substrate 21, 33. Also, after the completion of the electronic device 40, it is possible to easily examine an external appearance for examining whether the electronic components 28 mounted on the respective main surfaces 21x, 33x are positionally misaligned by separating the respective wiring substrate 21, 33.

Also, the respective contact parts 31.a, 34a of the first and second conductive contacts 31, 34 extend toward the sides of the respective wiring substrates 21, 31, so that it is possible to mount and demount the third conductive contacts 37 from the sides of the respective wiring substrates 21, 31. Thereby, it is possible to mount and demount the third conductive contact 37 with the respective wiring substrates 21, 31 being brought close to each other, so that it is possible to reduce a height of the electronic device 40.

Particularly, in the first exemplary embodiment, the first to third conductive contacts 31, 34, 37 have a U-shaped section, respectively, so that each of the horizontal parts 31.c, 31d, 34c, 34d, 37c, 37d has elasticity. Thereby, even when the respective wiring substrates 21, 33 are stacked in the process of FIG. 6, it is possible to disperse stress occurring at that time by the first to third conductive contacts 31, 34, 37.

Further, as shown in FIG. 9A, since the first horizontal part 31c of the first conductive contact 31 is connected to the first wiring substrate 21, the first conductive contact 31 and the first wiring substrate 21 are surface-contacted to each other. For this reason, the stress that is generated when stacking the respective wiring substrates 21, 33 in the process of FIG. 6 is dispersed at the first horizontal part 31c, so that it is possible to prevent the first wiring substrate 21 from being damaged due to the stress.

Likewise, as shown in FIG. 9B, since the first horizontal part 43c of the second conductive contact 34 is surface-contacted to the second wiring substrate 33, it is possible to prevent the second wiring substrate 33 from being damaged due to the stress.

The materials and shapes of the first to third conductive contacts 31, 34, 37 are the same, so that it is not necessary to individually manufacture the conductive contacts 31, 34, 37 and it is thus possible to save the manufacturing cost of the electronic device 40.

Second Exemplary Embodiment

In the first exemplary embodiment, as shown in FIG. 7, the first resin part 32 that is provided at one side of the first wiring substrate 21 is one. However, the number of the first resin part 32 is not limited to the above.

Figure 15:
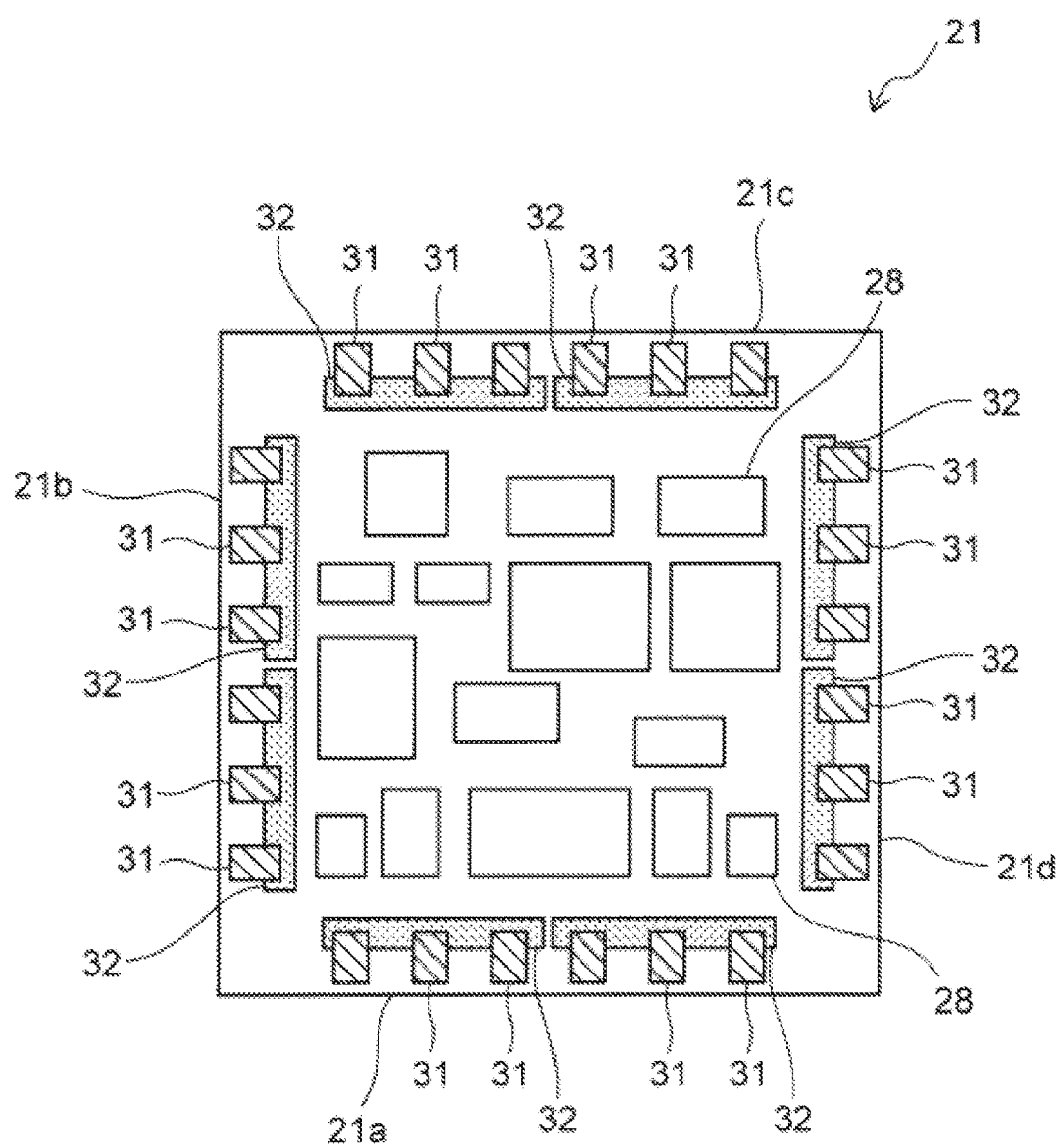
FIG. 15 is a plan view of a first wiring substrate in accordance with a second exemplary embodiment.

FIG. 15 is a plan view of the first wiring substrate 21 in accordance with a second exemplary embodiment.

Meanwhile, in FIG. 15, the same elements as those described in the first exemplary embodiment are denoted with the same reference numerals as those in the first exemplary embodiment and the descriptions thereof are omitted.

As shown in FIG. 15, in the second exemplary embodiment, two first resin parts 32 are provided at each of the sides 21a to 21d of the first wiring substrate 21.

Like this, even when the plurality of first resin parts 32 is provided at each of the sides 21a to 21d, it is possible to collectively handle the plurality of first conductive contacts 31 at each of the first resin parts 32, so that it is possible to easily mount the first conductive contacts 31 to the first wiring substrate 21.

Third Exemplary Embodiment

Figure 16:
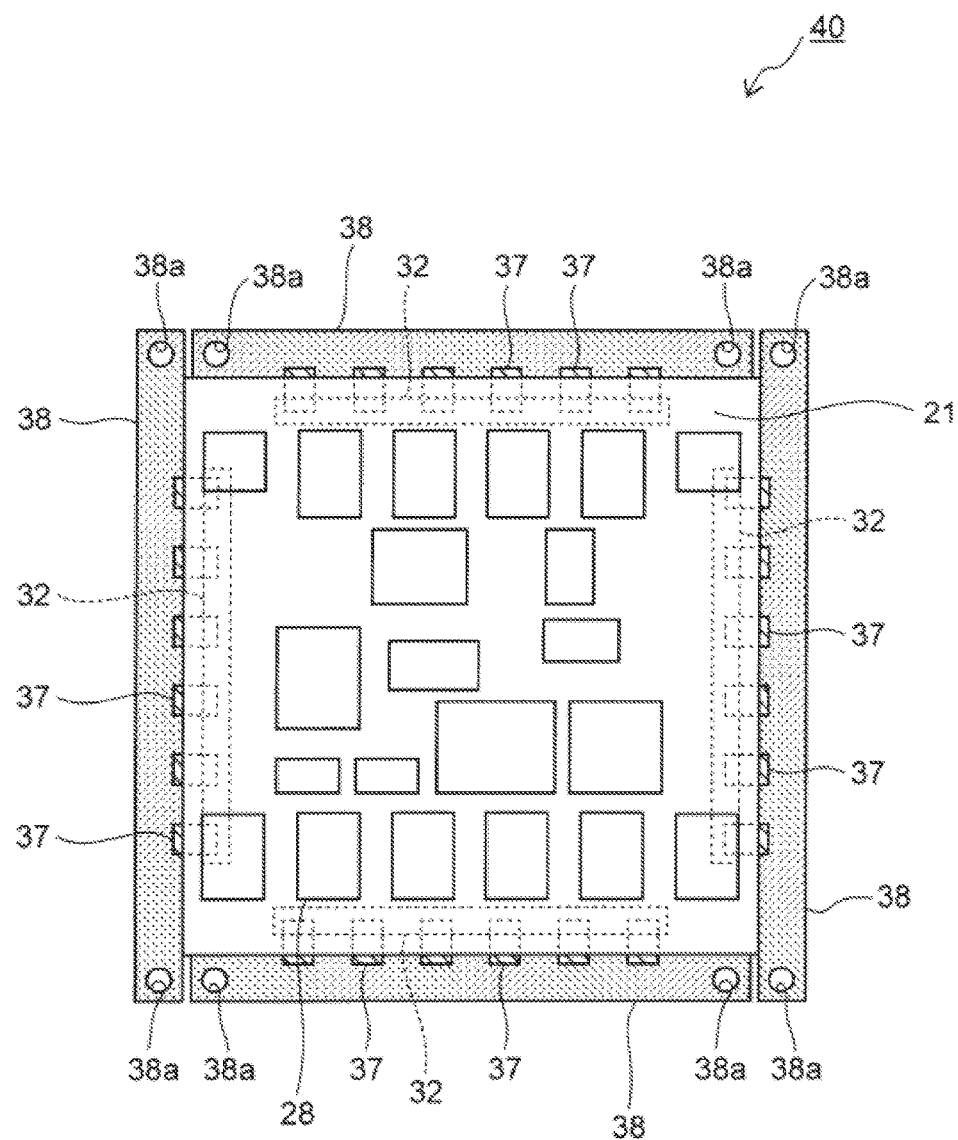
FIG. 16 is a plan view of an electronic device in accordance with a third exemplary embodiment.

FIG. 16 is a plan view of an electronic device in accordance with a third exemplary embodiment.

Meanwhile, in FIG. 16, the same elements as those described in the first exemplary embodiment are denoted with the same reference numerals as those in the first exemplary embodiment and the descriptions thereof are omitted.

As shown in FIG. 16, in the first exemplary embodiment, a hole 38a is formed at each end portion of the third resin part 38.

A utility of the hole 38a is not particularly limited.

Figure 17A:
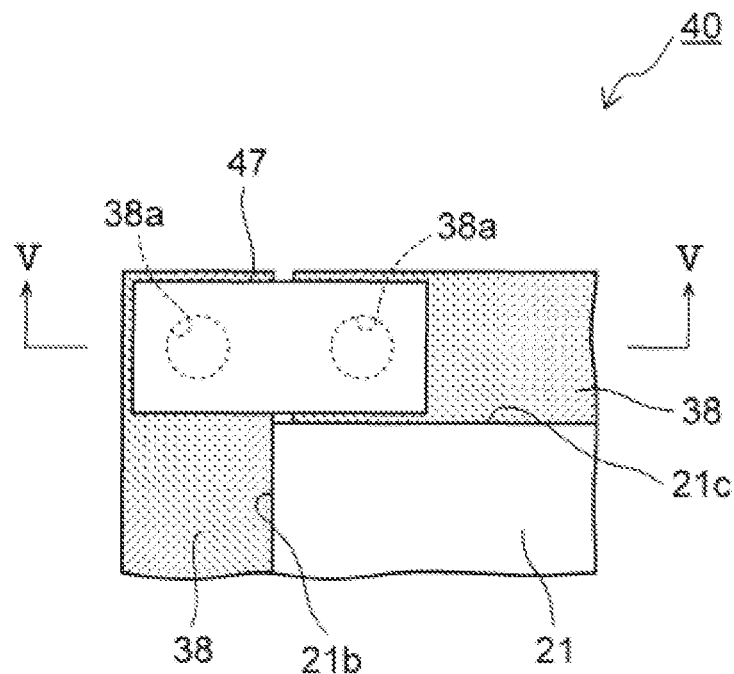
FIG. 17A is an enlarged plan view depicting an example of a utility of a hole in the third exemplary embodiment.
Figure 17B:
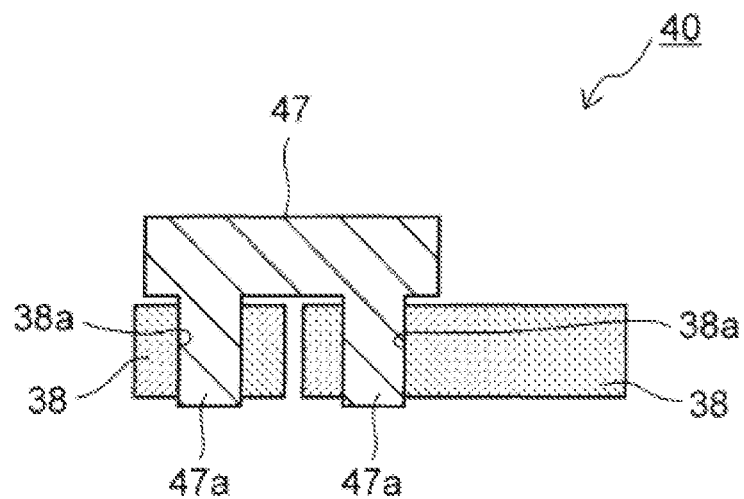
FIG. 17B is a sectional view taken along a line V-V of FIG. 17A.

FIG. 17A is an enlarged plan view depicting an example of the utility of the hole 38a, and FIG. 17B is a sectional view taken along a line V-V of FIG. 17A.

As shown in FIGS. 17A and 17B, in the second exemplary embodiment, a metallic coupling part 47 having two pins 47a is prepared. Then, the pins 47a are fitted in the respective holes 38a of the third resin parts 38 corresponding to the two adjacent sides 21b, 21c of the first wiring substrate 21.

Thereby, the third resin parts 38 adjacent to each other are coupled by the coupling part 47, so that the third conductive contacts 37 (refer to FIG. 16) are difficult to be detached from the electronic device 40 due to a shock or the like after the electronic device 40 is completed.

In the meantime, the coupling part 47 can be detachably mounted in the holes 38a. When there is no concern that the third conductive contacts 37 will not be detached from the electronic device 40, the coupling part 47 may be detached from the holes 38a.

Figure 18A:
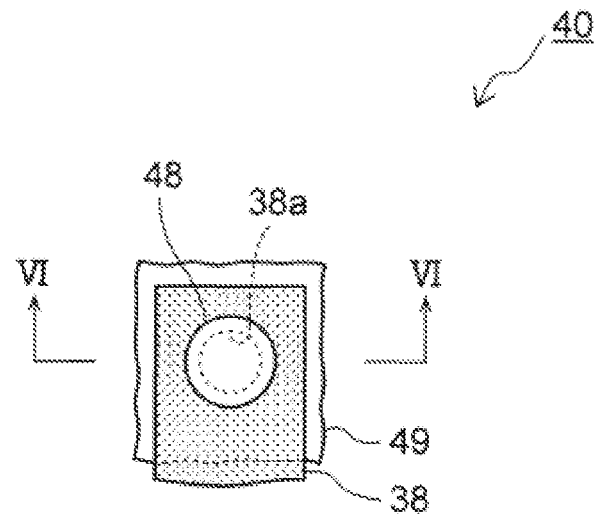
FIG. 18A is an enlarged plan view depicting another example of the utility of the hole in the third exemplary embodiment.
Figure 18B:
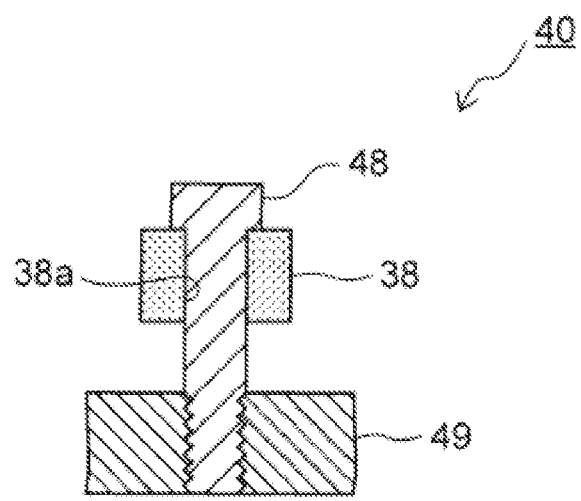
FIG. 18B is a sectional view taken along a line VI-VI of FIG. 18A.

In the meantime, FIG. 18A is an enlarged plan view depicting another example of the utility of the hole 38a, and FIG. 18B is a sectional view taken along a line VI-VI of FIG. 18A.

In the example of FIGS. 18A and 18B, a screw 48 is inserted in the hole 38a, and the electronic device 40 is fixed to a housing 49 by the screw 48.

Thereby, it is possible to fix the electronic device 40 to the housing 49 without forming a hole for the screw 48 in the first wiring substrate 21 (refer to FIG. 16) or the second wiring substrate 33.

Fourth Exemplary Embodiment

Figure 19:
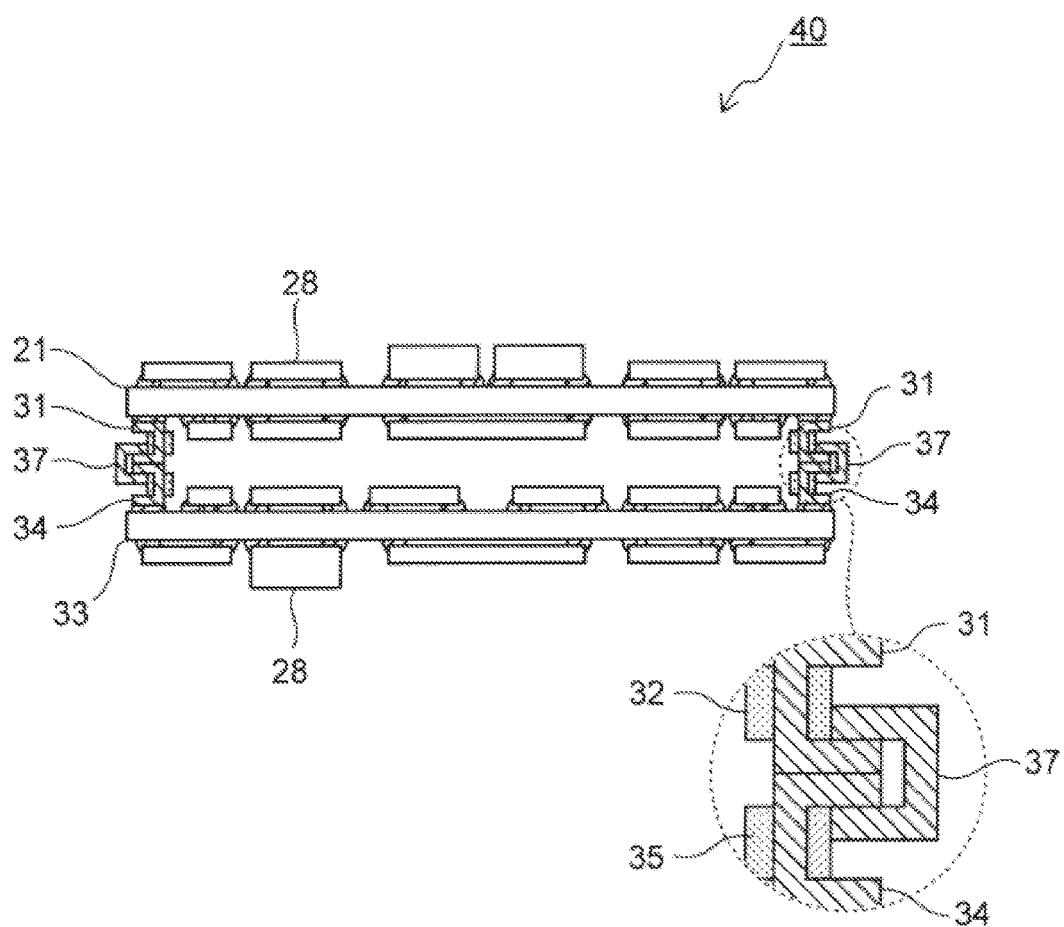
FIG. 19 is a sectional view of an electronic device in accordance with a fourth exemplary embodiment.

FIG. 19 is a sectional view of an electronic device in accordance with a fourth exemplary embodiment.

Meanwhile, in FIG. 19, the same elements as those described in the first exemplary embodiment are denoted with the same reference numerals as those in the first exemplary embodiment and the descriptions thereof are omitted.

As shown in FIG. 19, in the electronic device 40 of the fourth exemplary embodiment, the third resin part 38 (refer to FIG. 12) for coupling the plurality of third conductive contacts 37 is omitted. When there is no problem even if each of the third conductive contacts 37 is individually handled, the third resin part 38 may be omitted. Thereby, it is not necessary to embed the third conductive contacts 37 in the third resin part 38 by the injection molding, so that it is possible to save the cost relating to the injection molding.

Fifth Exemplary Embodiment

In the first to fourth exemplary embodiments, as shown in FIG. 8, the plurality of first conductive contacts 31 is coupled by the first resin part 32.

In contrast, in the fifth exemplary embodiment, the first resin part 32 is omitted.

Figure 20:
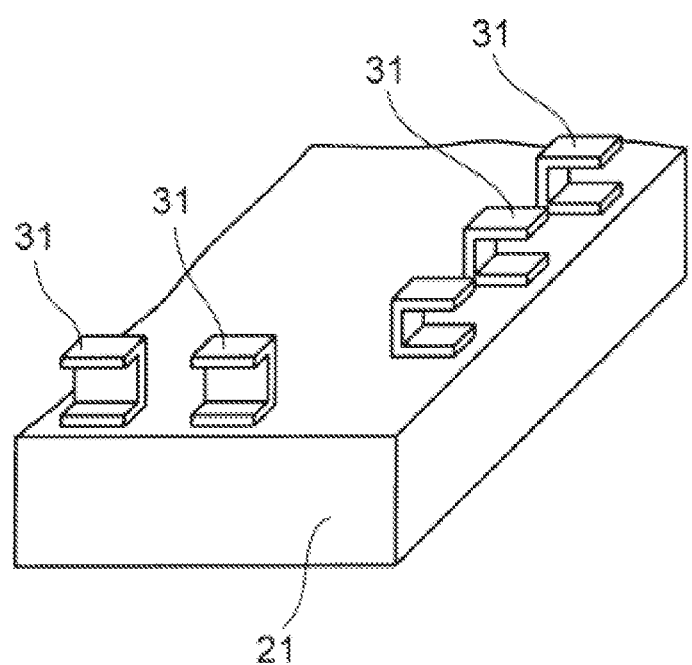
FIG. 20 is an enlarged perspective view of a corner part of a first wiring substrate in accordance with a fifth exemplary embodiment.

FIG. 20 is an enlarged perspective view of a corner part of the first wiring substrate 21 in accordance with the fifth exemplary embodiment.

As shown in FIG. 20, in the fifth exemplary embodiment, the first resin part 32 for coupling the plurality of first conductive contacts 31 is omitted. Thereby, it is not necessary to embed the first conductive contacts 31 in the first resin part 32 by the injection molding, so that it is possible to save the cost relating to the injection molding.

Figure 21:
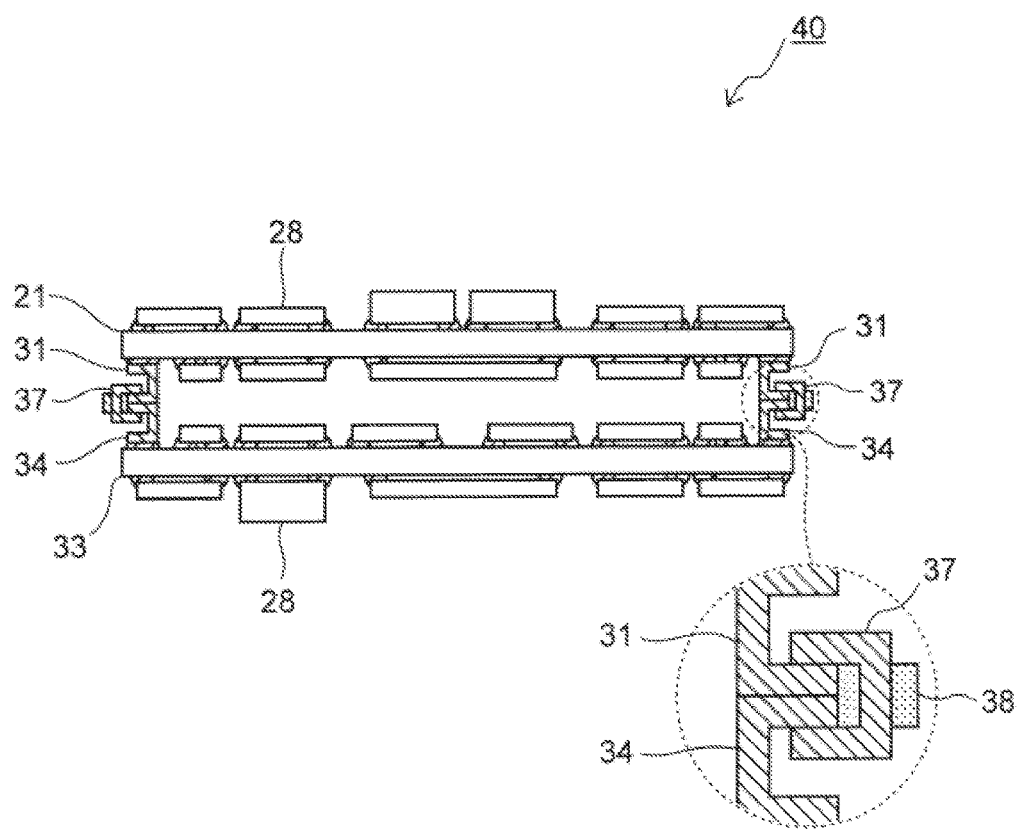
FIG. 21 is a sectional view of an electronic device in accordance with the fifth exemplary embodiment.

FIG. 21 is a sectional view of the electronic device 40 in accordance with the fifth exemplary embodiment.

Meanwhile, in FIG. 21, the same elements as those described in the first exemplary embodiment are denoted with the same reference numerals as those in the first exemplary embodiment and the descriptions thereof are omitted.

As shown in FIG. 21, in the fifth exemplary embodiment, the second resin part 35 (refer to FIG. 6) for coupling the plurality of second conductive contacts 34 is also omitted. Thereby, it is possible to save the cost for manufacturing the first resin part 32 and the second resin part 35 by the injection molding.

Sixth Exemplary Embodiment

In a sixth exemplary embodiment, the electronic components 28 between the wiring substrates 21, 33 are sealed as follows.

Figure 22:
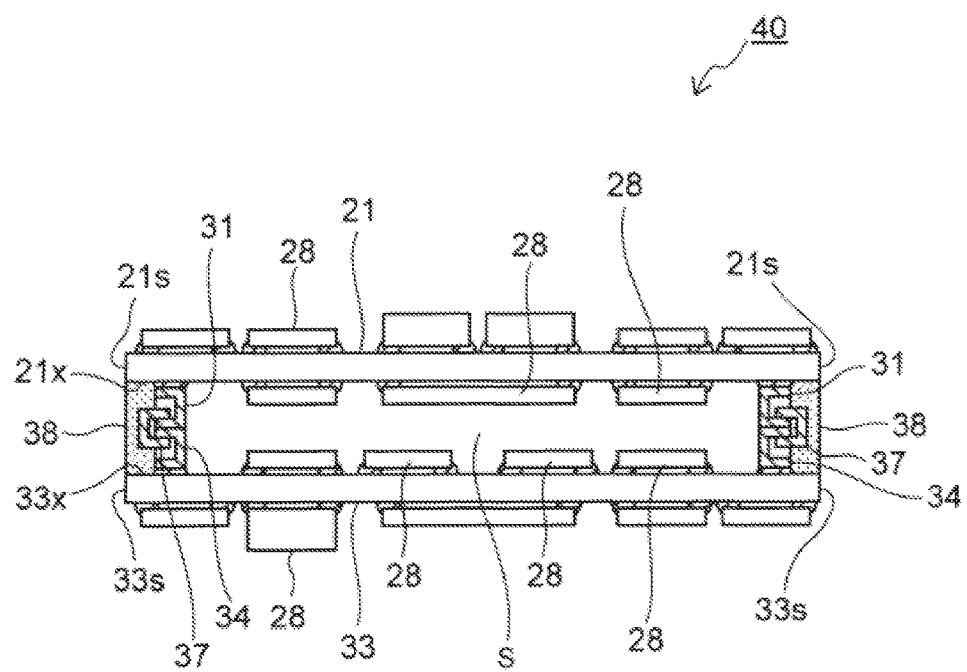
FIG. 22 is a sectional view of an electronic device in accordance with a sixth exemplary embodiment.

FIG. 22 is a sectional view of an electronic device in accordance with the sixth exemplary embodiment.

Meanwhile, in FIG. 22, the same elements as those described in the first exemplary embodiment are denoted with the same reference numerals as those in the first exemplary embodiment and the descriptions thereof are omitted. This applies to FIG. 23, too.

As shown in FIG. 22, in the electronic device 40, the third resin parts 38 are closely contacted to the main surfaces 21x, 33x of the respective wiring substrates 21, 33, so that a space S between the main surfaces 21x, 33x is sealed by the third resin parts 38.

Thereby, it is possible to prevent foreign matters such as dusts in the atmosphere from being introduced into the space S by the third resin parts 38, so that it is possible to suppress the foreign matters from being attached to the electronic components 28 in the space S. Also, since the attachment of the foreign matters is suppressed, it is possible to mount the electronic component 28, which is not provided with a resin seal for protecting a bare chip from the foreign matters, in the space S, so that it is possible to mount the various electronic components 28 on the electronic device 40.

In this case, the electronic components 28 to be accommodated in the space S are preferably provided at parts distant from outer periphery surfaces 21s, 33s of the respective wiring substrates 21, 33. Thereby, parts at which the third resin parts 38 are to be closely contacted to the respective main surfaces 21x, 33x, are secured, so that it is possible to easily prevent the foreign matters from being introduced into the space S by the third resin parts 38.

The sealing method of the space S is not limited to the above.

Figure 23:
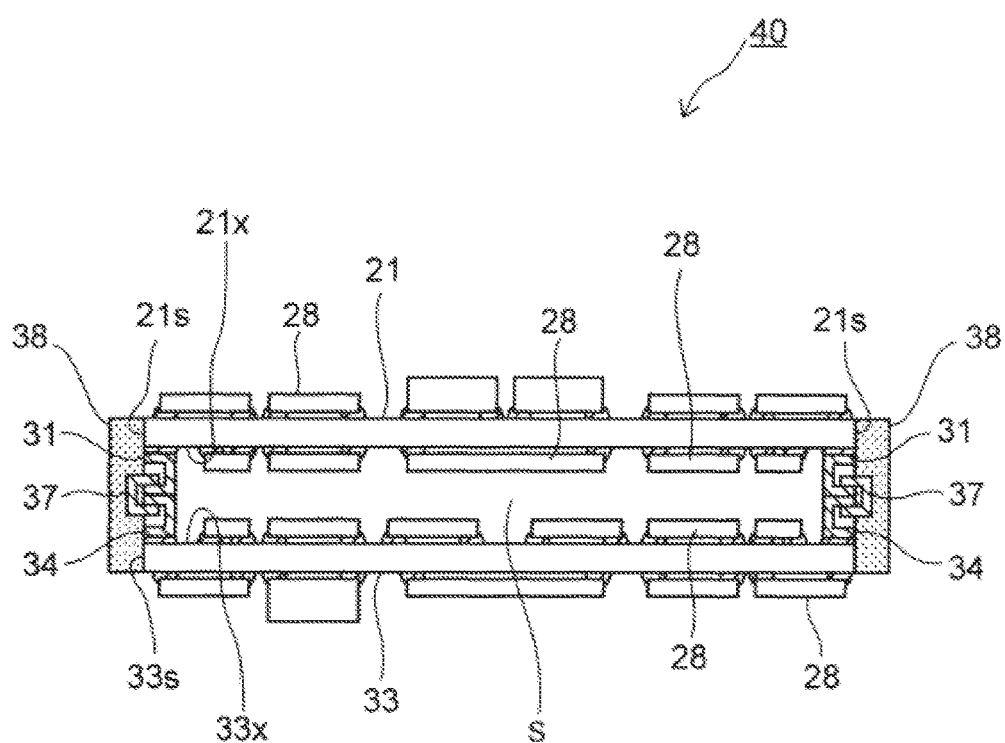
FIG. 23 is a sectional view of an electronic device in accordance with another example of the sixth exemplary embodiment.

FIG. 23 is a sectional view of the electronic device 40 in accordance with another example of the sixth exemplary embodiment.

As shown in FIG. 23, in this example, the third resin parts 38 are closely contacted to the outer periphery surfaces 21s, 33s of the respective wiring substrates 21, 33, so that it is possible to seal the space S, thereby preventing the foreign matters from being introduced into the space S.

According to the above structure, since it is not necessary to secure the parts, to which the third resin parts 38 are to be closely contacted, on the respective main surfaces 21x, 33x, it is possible to accommodate the more electronic components 28 in the space S.

Seventh Exemplary Embodiment

In a seventh exemplary embodiment, the electronic device is miniaturized as follows.

Figure 24A:
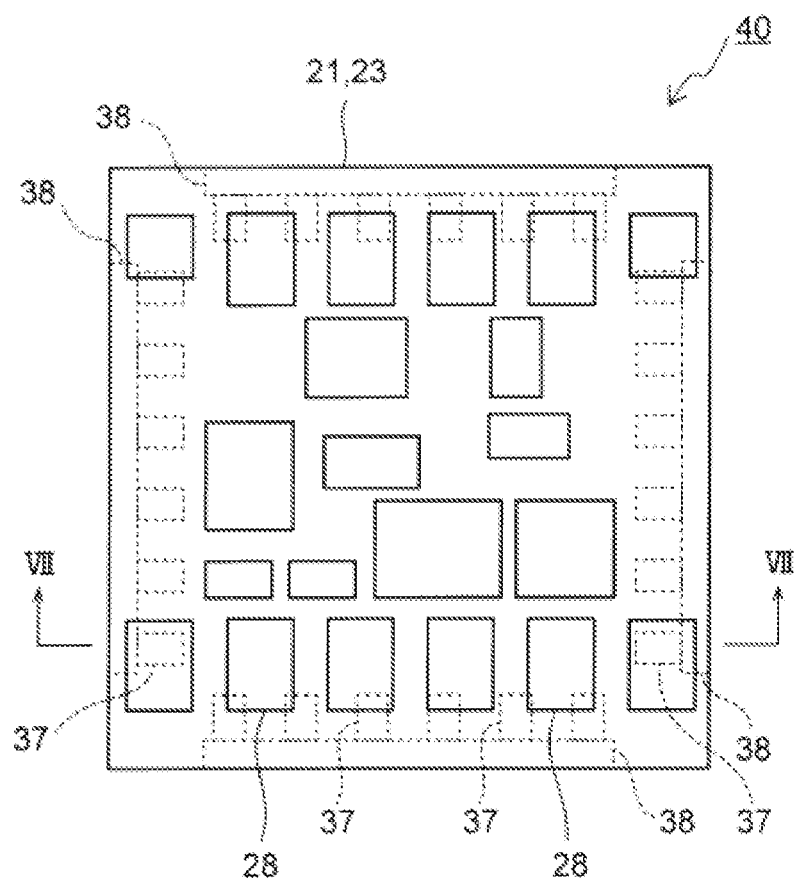
FIG. 24A is a plan view of an electronic device in accordance with a seventh exemplary embodiment.
Figure 24B:
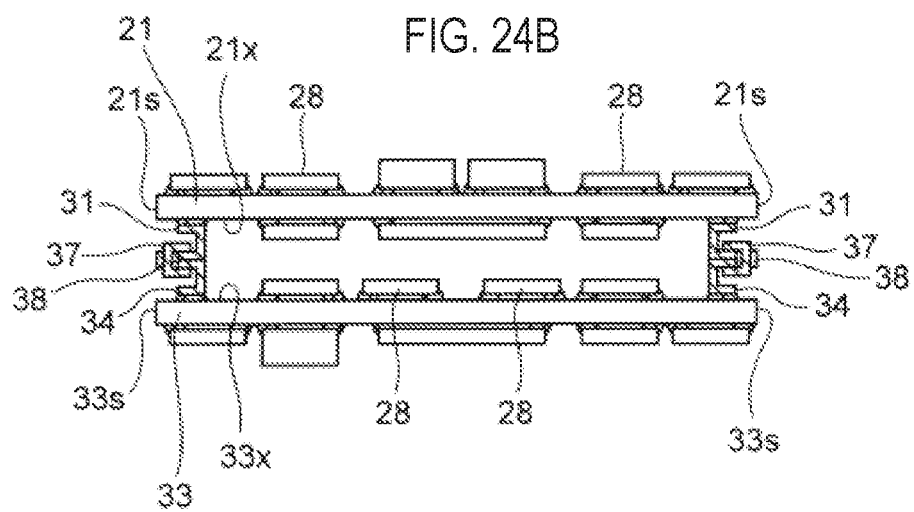
FIG. 24B is a sectional view taken along a line VII-VII of FIG. 24A.

FIG. 24A is a plan view of an electronic device in accordance with the seventh exemplary embodiment, and FIG. 24B is a sectional view taken along a line VII-VII of FIG. 24A.

As shown in FIG. 24A, in the electronic device 40, the third resin parts 38 do not protrude from the respective wiring substrates 21, 33, as seen from above, and the third resin parts 38 are accommodated in the respective wiring substrates 21, 33. Thereby, it is possible to miniaturize the electronic device 40, as compared to a configuration where the third resin parts 38 protrude from the respective wiring substrates 21, 33.

In this case, as shown in FIG. 24B, preferably, the electronic components 28 to be mounted on the respective main surfaces 21x, 33x are provided at an area distant from the outer periphery surfaces 21s, 33s of the respective wiring substrates 21, 33, and the space for accommodating therein the third resin parts 38 is provided between the main surfaces 21x, 33x.

Eighth Exemplary Embodiment

In an eighth exemplary embodiment, a favorable shape of each of the conductive contacts 31, 34, 37 is described.

Figure 25A:
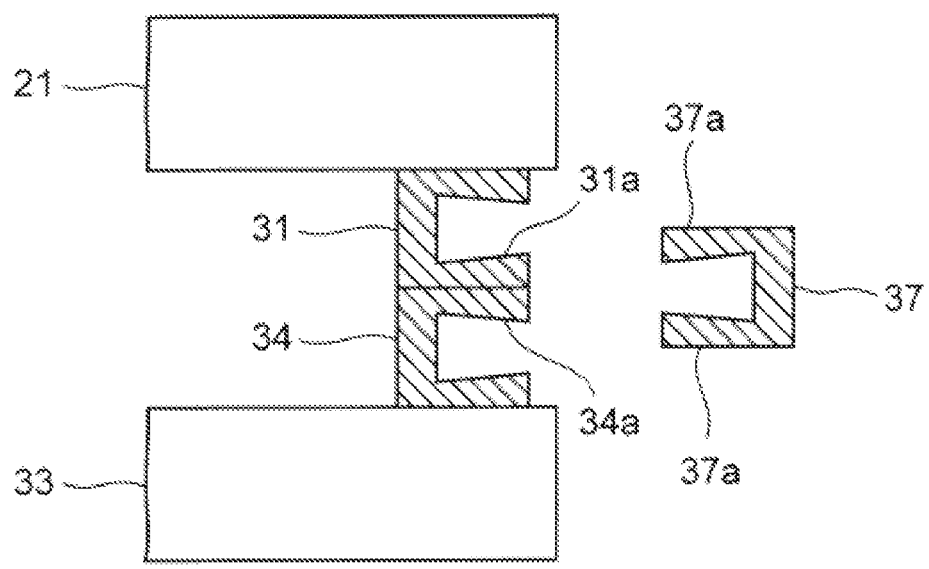
FIG. 25A is a sectional view of a third conductive contact before it is mounted to first and second conductive contacts in an eighth exemplary embodiment.

FIG. 25A is a sectional view of the third conductive contact 37 before it is mounted to the first and second conductive contacts 31, 34.

As shown in FIG. 25A, in the eighth exemplary embodiment, the first contact part 31a of the first conductive contact 31 is made to have a tapered shape thickening toward the side of the first wiring substrate 21, as seen from a cross sectional view. Likewise, the second contact part 34a of the second conductive contact 34 has a tapered shape thickening toward the side of the second wiring substrate 33, as seen from a cross sectional view.

The third contact part 37a of the third conductive contact 37 has a tapered shape conforming to the first contact part 31a and the second contact part 34a, as seen from a cross sectional view.

Figure 25B:
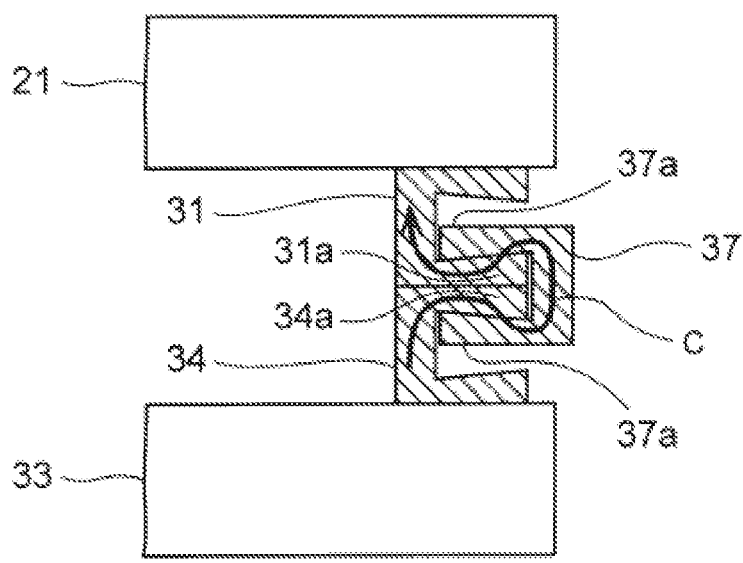
FIG. 25B is a sectional view of the third conductive contact after it is mounted to the first and second conductive contacts.

FIG. 25B is a sectional view of the third conductive contact 37 after it is mounted to the first and second conductive contacts 31, 34.

As shown in FIG. 25B, the respective conductive contacts 31, 34, 37 are made to have the tapered shape, respectively, as described above, so that the third conductive contact 37 is difficult to separate from the first and second conductive contacts 31, 34.

Furthermore, when mounting the third conductive contact 37 to the first and second conductive contacts 31, 34, the third contact part 37a is rubbed to the first and second contact parts 31a, 34a, so that a natural oxide film on the surface of each of the conductive contacts 31, 34, 37 is scratched.

As a result, a clean surface of metal is exposed to the surface of each of the conductive contacts 31, 34, 37 and the current is enabled to flow along a path C passing through the clean surface and having a smaller electric resistance, so that it is possible to electrically connect the respective wiring substrates 21, 33, irrespective of whether or not the natural oxide film.

In the meantime, the shape of each of the conductive contacts 31, 34, 37 for accomplishing the above effects is not limited to the eighth exemplary embodiment. That is, also in the conductive contacts 31, 34, 37 described in the first to seventh exemplary embodiments, the same effects are accomplished.

Ninth Exemplary Embodiment

In a ninth exemplary embodiment, a favorable shape of the third conductive contact 37 is described.

Figure 26:
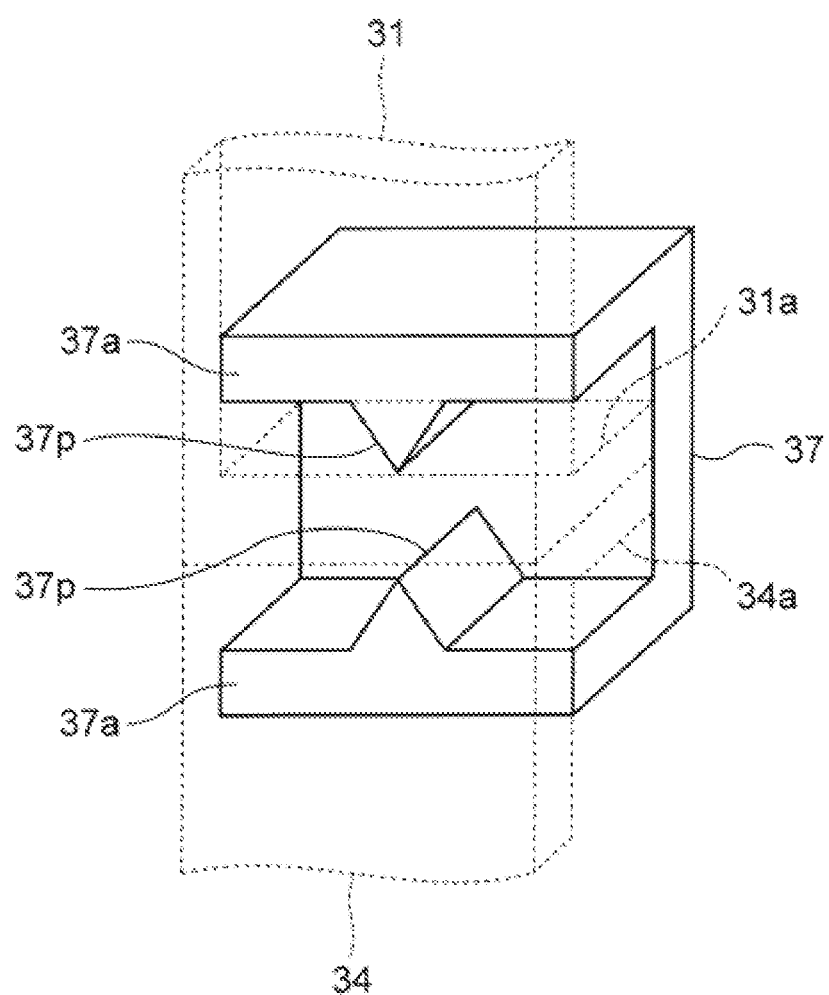
FIG. 26 is a perspective view of a third conductive contact in accordance with a ninth exemplary embodiment.

FIG. 26 is a perspective view of the third conductive contact 37 in accordance with the ninth exemplary embodiment. Meanwhile, in FIG. 26, the same elements as those described in the first to eighth exemplary embodiments are denoted with the same reference numerals as those in the first to eighth exemplary embodiments and the descriptions thereof are omitted.

As shown in FIG. 26, in the ninth exemplary embodiment, the third contact parts 37a of the third conductive contact 37 are respectively provided with protrusions 37p facing each other. The protrusions 37p face toward the contact parts 31a, 34a of the first conductive contact 31 and the second conductive contact 34, and are configured to slidably contact the respective contact parts 31a, 34a.

Thereby, when mounting the third conductive contact 37 to the first and second conductive contacts 31, 34, the natural oxide films on the surfaces of the respective conductive contacts 31, 34 are scratched by the protrusions 37p and the clean surfaces of metal are exposed to the conductive contacts 31, 34.

As a result, like the eighth exemplary embodiment, the current is enabled to flow along the path C (refer to FIG. 25B) passing through the clean surface and having a smaller electric resistance, so that it is possible to reduce the electric resistance between the respective wiring substrates 21, 33.

Particularly, in this exemplary embodiment, a tip end of the protrusion 37p is sharpened, so that it is possible to simply remove the natural oxide film on the surface of each of the conductive contacts 31, 34 by the protrusion 37p.

The shape of the protrusion 37p is not limited to the above.

Figure 27:
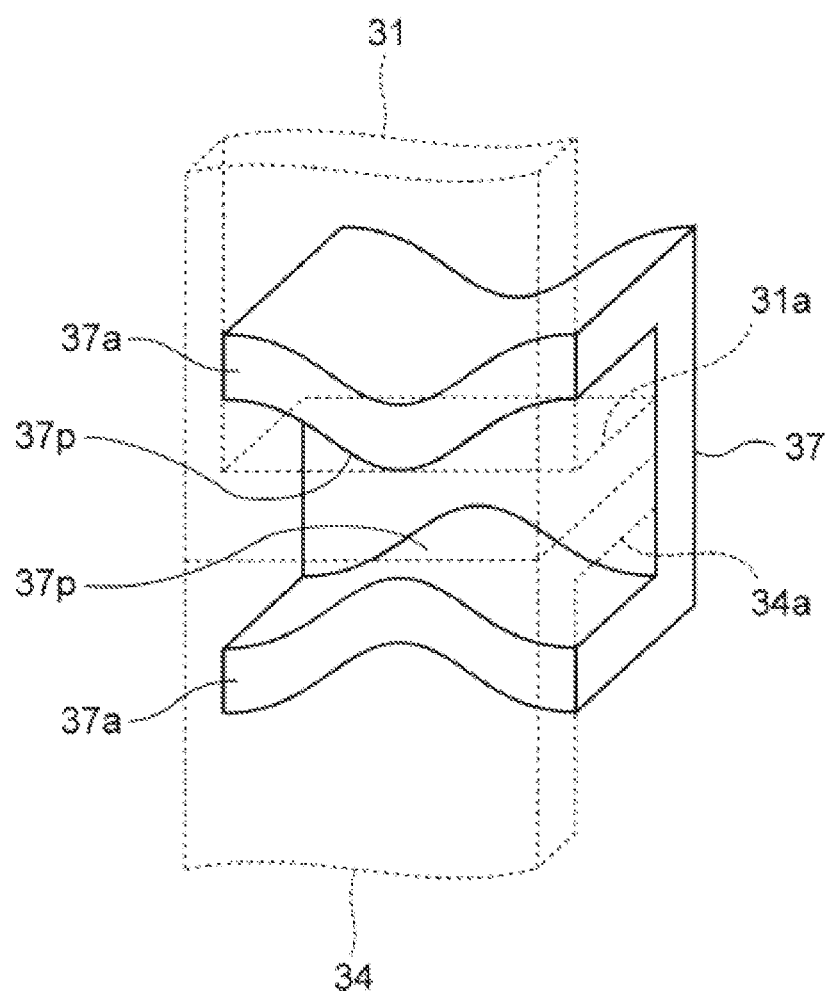
FIG. 27 is a perspective view of a third conductive contact in accordance with another example of the ninth exemplary embodiment.

FIG. 27 is a perspective view of the third conductive contact 37 in accordance with another example of the ninth exemplary embodiment.

In this example, the protrusion 37p is provided to be curved toward each of the contact parts 31a, 34a. Even with this shape, it is possible to remove the natural oxide film by the protrusion 37p, like the example of FIG. 26.

Other Exemplary Embodiments

In the first to ninth exemplary embodiments, the first conductive contact 31 and the second conductive contact 34 have a U-shaped section, respectively. However, the sectional shape of each of the conductive contacts 31, 34 is not limited thereto.

Figure 28:
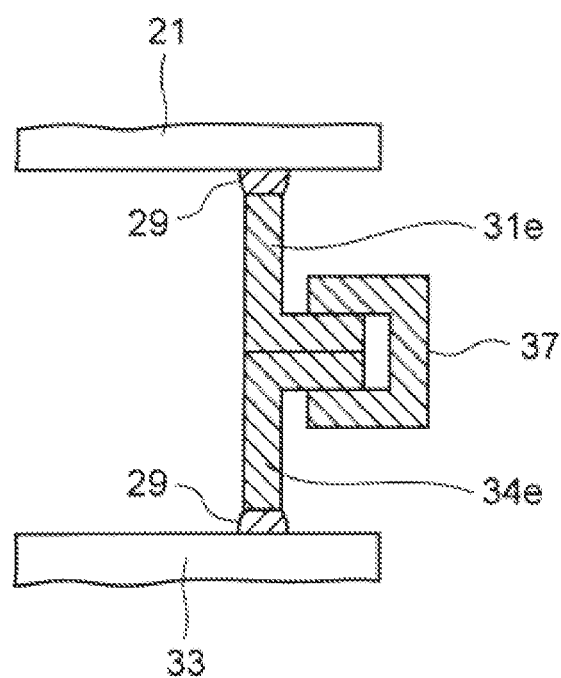
FIG. 28 is an enlarged sectional view of first to third conductive contacts and a surrounding thereof in accordance with another exemplary embodiment.

For example, as shown in an enlarged sectional view of FIG. 28, the first horizontal parts 31c, 34c (refer to FIGS. 9A and 9B) of the conductive contacts 31, 34 may be omitted, and the upright parts 31e, 34e may be provided upright on the respective wiring substrates 21, 33.

Figure 29:
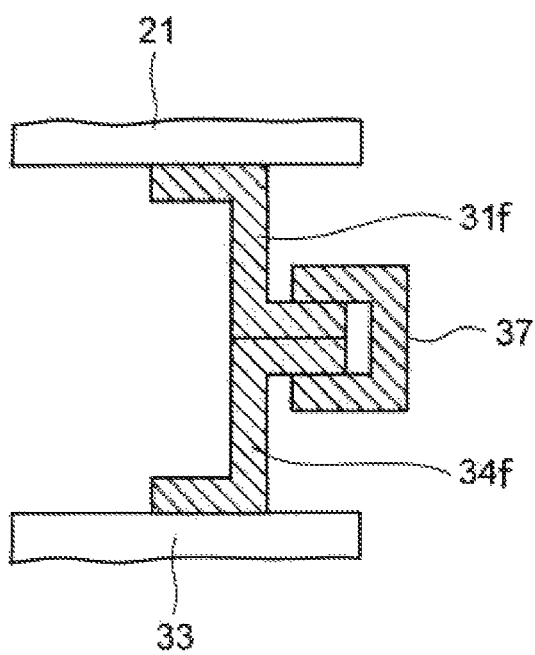
FIG. 29 is an enlarged sectional view of first to third conductive contacts and a surrounding thereof in accordance with another exemplary embodiment.

For example, as shown in an enlarged sectional view of FIG. 29, the first horizontal parts 31c, 34c (refer to FIGS. 9A and 9B) of the conductive contacts 31, 34 may be formed so as to extend in a direction opposite to the extending direction of the second horizontal parts 31a, 34a (i.e., the first horizontal parts 31c, 34c of the conductive contacts 31, 34 may be formed so as to extend toward the center of the respective wiring substrates 21, 33).

What is claimed is:

1. An electronic device comprising:
a first wiring substrate having a first main surface:
a plurality of first conductive contacts, each of which is provided upright on a peripheral edge part of the first main surface, has a U-shape opening toward a side of the first wiring substrate, and comprises a first contact part extending toward the side of the first wiring substrate,
a second wiring substrate having a second main surface facing the first main surface;
a plurality of second conductive contacts, each of which is provided upright on a peripheral edge part of the second main surface, has a U-shape opening toward a side of the second wiring substrate, and comprises a second contact part extending toward the side of the second wiring substrate and being in contact with the first contact part, and;
a plurality of third conductive contacts, each of which has a U-shape opening toward each of the first conductive contact and the second conductive contact and is configured to sandwich the first contact part, and the second contact part, from a side of each of the first wiring substrate and the second wiring substrate and to fix the first wiring substrate and the second wiring substrate; and a plurality of electronic components mounted on each of the first wiring substrate and the second wiring substrate; and a first resin part configured to couple each of the plurality of first conductive contacts; and a second resin part configured to couple each of the plurality of second conductive contacts; and a third resin part configured to couple each of the plurality of third conductive contacts.

2. The electronic device according to claim 1, wherein each of the first wiring substrate and the second wiring substrate has a plurality of sides, as seen from above, and wherein the third resin part is respectively provided at each of the plurality of sides.

3. The electronic device according to claim 1, wherein at least one of the plurality of electronic components is mounted on at least one of the first main surface and the second main surface, and wherein a space between the first main surface and the second main surface is sealed by the third resin part.

4. The electronic device according to claim 3, wherein said at least one of the electronic components is provided at an area distant from an outer periphery surface of each of the first wiring substrate and the second wiring substrate, and wherein the third resin part is closely contacted to each of the first main surface and the second main surface, so that the space is sealed.

5. The electronic device according to claim 3, wherein the third resin part is closely contacted to an outer periphery surface of each of the first wiring substrate and the second wiring substrate, so that the space is sealed.

6. The electronic device according to claim 1, wherein each of the third conductive contacts has a pair of third contact parts configured to sandwich the first contact part and the second contact part, and wherein each of the third contact parts is provided with a protrusion configured to slidably contact each of the first contact part and the second contact part.

7. The electronic device according to claim 1, wherein the first contact part has a tapered shape thickening toward a side of the first wiring substrate, as seen from a cross sectional view, wherein the second contact part has a tapered shape thickening toward a side of the second wiring substrate, as seen from a cross sectional view, and wherein the third conductive contact has a pair of third contact parts configured to sandwich the first contact part and the second contact part and having a tapered shape conforming to the first contact part and the second contact part, as seen from a cross sectional view.

8. The electronic device according to claim 1, wherein shapes and sizes of the first conductive contact, the second conductive contact, and the third conductive contact are the same.

* * * * *